(12) United States Patent
Tian et al.

(10) Patent No.: US 9,351,426 B2
(45) Date of Patent: May 24, 2016

(54) HEAT DISSIPATING DEVICE AND BLADE SERVER

(71) Applicant: Huawei Technologies Co., Ltd., Shenzhen (CN)

(72) Inventors: Weiqiang Tian, Shenzhen (CN); Jianxing Liao, Shenzhen (CN); Ruifeng Shui, Shenzhen (CN); Mingliang Hao, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 260 days.

(21) Appl. No.: 14/077,455

(22) Filed: Nov. 12, 2013

(65) Prior Publication Data

US 2014/0071618 A1    Mar. 13, 2014

Related U.S. Application Data

(63) Continuation of application No. PCT/CN2012/080699, filed on Aug. 29, 2012.

(30) Foreign Application Priority Data

Jan. 20, 2012  (CN) .......................... 2012 1 0018965

(51) Int. Cl.
*H05K 7/20* (2006.01)
*G06F 1/20* (2006.01)

(52) U.S. Cl.
CPC .............. *H05K 7/20754* (2013.01); *G06F 1/20* (2013.01); *H05K 7/20727* (2013.01)

(58) Field of Classification Search
CPC ... G06F 1/20; H05K 7/20727; H05K 7/20754
USPC .................................................. 361/679.54
See application file for complete search history.

(56) References Cited

U.S. PATENT DOCUMENTS

| | | | | |
|---|---|---|---|---|
| 6,836,409 B1* | 12/2004 | Duxbury | ............ | H05K 7/20509 165/185 |
| 2009/0262495 A1 | 10/2009 | Neudorfer | | |
| 2011/0299240 A1* | 12/2011 | Kimura | ............. | H05K 7/20727 361/679.49 |

FOREIGN PATENT DOCUMENTS

| | | |
|---|---|---|
| CN | 101211205 A | 7/2008 |
| CN | 101799709 A | 8/2010 |

(Continued)

OTHER PUBLICATIONS

Foreign Communication From a Counterpart Application, Chinese Application No. 201210018965.4, Chinese Office Action dated Aug. 5, 2013, 4 pages.
Foreign Communication From a Counterpart Application, Chinese Application No. 201210018965.4, Chinese Search Report dated Jul. 26, 2013, 2 pages.

(Continued)

*Primary Examiner* — Tuan T Dinh
*Assistant Examiner* — Mukund G Patel
(74) *Attorney, Agent, or Firm* — Conley Rose, P.C.; Grant Rodolph; Nicholas K. Beaulieu

(57) ABSTRACT

Embodiments of the present invention relate to a heat dissipating device including a chassis, a backplane, at least one rear board, and at least one fan, where the chassis includes horizontal wall panels, vertical wall panels, and a rear wall panel; the chassis includes one or more partition plates; the rear board includes one or more second hole areas; and the one or more partition plates, the horizontal wall panels, the vertical wall panels, the rear wall panel, the backplane, and the rear board form a cooling air duct that does not pass a front board, so that under an effect of the fan, a cooling air flow is discharged out of the chassis after passing the rear board, the second hole area, and the fan, so as to implement heat dissipation for a functional module on the rear board.

11 Claims, 14 Drawing Sheets

(56) References Cited

FOREIGN PATENT DOCUMENTS

| CN | 201716631 U | 1/2011 |
| CN | 201955725 U | 8/2011 |
| CN | 102436298 A | 5/2012 |
| TW | 200921342 A | 5/2009 |
| WO | 2011053305 A1 | 5/2011 |

OTHER PUBLICATIONS

Foreign Communication From a Counterpart Application, PCT Application No. PCT/CN2012/080699, International Search Report dated Dec. 6, 2012, 7 pages.

Foreign Communication From a Counterpart Application, PCT Application No. PCT/CN2012/080699, Written Opinion dated Dec. 6, 2012, 4 pages.

* cited by examiner

HEAT DISSIPATING DEVICE AND BLADE SERVER

CROSS-REFERENCE TO RELATED APPLICATIONS

This application is a continuation of International Application No. PCT/CN2012/080699, filed on Aug. 29, 2012, which claims priority to Chinese Patent Application No. 201210018965.4, filed on Jan. 20, 2012, both of which are hereby incorporated by reference in their entireties.

STATEMENT REGARDING FEDERALLY SPONSORED RESEARCH OR DEVELOPMENT

Not applicable.

REFERENCE TO A MICROFICHE APPENDIX

Not applicable.

TECHNICAL FIELD

The present invention relates to the field of heat dissipation, and in particular to a heat dissipating device used for a blade server and a blade server.

BACKGROUND

An increasingly high operation and maintenance cost, an increasing power supply cooling cost, and fast-growing storage capacity and data traffic bandwidth requirements pose a greatest challenge faced by an enterprise data center, and also bring a great business opportunity for a data center device vendor. A very high requirement is imposed for heat dissipation, so as to solve heat dissipation and energy-saving design of a high-density server, and meanwhile, to enable a same device to adapt to different environments, especially for heat dissipation of a high-density switch board that includes multiple optical modules. A common structure of a server is as follows: A computing node board of the server exists at a front side, and an input/output switch board exists at a rear side, where the computing node board and the input/output switch board are vertically interconnected together through a backplane, for example, the computing node board is horizontally disposed while the input/output switch board is vertically disposed.

A common blade server adopts a vertical manner in which a front board is vertically inserted while a rear board is horizontally inserted, and its heat dissipating air duct adopts the following heat dissipation manner: A front board is vertically inserted in a perforated backplane; and a cooling air flow enters from a front panel, passes a ventilation hole on the backplane, and is discharged by a fan on a rear wall panel. The fan is horizontally disposed on upper and lower edges of the rear wall panel, an air intake channel is reserved on both sides of a chassis, and air enters from the top on two sides of the rear board. In this way, an air duct structure experiences a vertical-to-horizontal conversion process. This causes a complex air duct and great fluid resistance, and is not conducive to heat dissipation. In addition, when the cooling air flow passes a functional module on the rear board, a cascade heating effect exists, causing difficulty in heat dissipation.

Another common blade server adopts a vertical manner in which a front board is horizontally inserted while a rear board is vertically inserted, and its heat dissipating air duct adopts the following heat dissipation manner: A front board is horizontally inserted in a perforated backplane; and a cooling air flow enters from a front panel, passes a ventilation hole on the backplane, and is discharged by a fan on a rear wall panel. The fan is vertically disposed in a middle area of the rear wall panel, an air intake channel is reserved on a lower side of a chassis, and an air flow goes upward from a bottom of the rear board to traverse a functional module on the rear board. This causes a complex air duct and great fluid resistance, and is not conducive to heat dissipation. In addition, when the cooling air flow passes the functional module on the rear board, a cascade heating effect exists, causing poor heat dissipation of the rear board.

SUMMARY

An objective of the present invention is to provide a heat dissipating device of higher heat dissipation efficiency for a blade server, so as to solve a problem in the prior art that a heat dissipation capability of a rear board is poor due to a cascade heating effect.

A heat dissipating device used for a blade server is provided according to an embodiment of the present invention, where the device includes: a chassis, a backplane, at least one rear board, and at least one fan, where: the chassis includes horizontal wall panels, vertical wall panels, and a rear wall panel; the backplane is disposed in the chassis, and configured to connect to a front board inserted from the front of the chassis and the rear board inserted from the back of the chassis; the fan is disposed in a rear part of the chassis, and configured to dissipate heat out of the chassis; the backplane has one or more first hole areas, so that under an effect of the fan, heat generated by the front board is discharged out of the chassis through the one or more first hole areas after passing the backplane and the fan; and the chassis includes one or more partition plates; the rear board includes one or more second hole areas; and the one or more partition plates, the horizontal wall panels, the vertical wall panels, the rear wall panel, the backplane, and the rear board form a cooling air duct that does not pass the front board, so that under the effect of the fan, a cooling air flow is discharged out of the chassis after passing the rear board, the one or more second hole area, and the fan, so as to implement heat dissipation for a functional module on the rear board.

A blade server is provided according to an embodiment of the present invention, where the blade server includes a heat dissipating device in an embodiment of the present invention.

A heat dissipating air duct of the heat dissipating device according to the embodiments of the present invention has a simple structure, and no cascade heating effect exists when a cooling air flow passes a rear board, thereby improving a heat dissipation capability of the rear board.

BRIEF DESCRIPTION OF THE DRAWINGS

To illustrate the technical solutions in the embodiments of the present invention more clearly, the following briefly introduces accompanying drawings required for describing the embodiments. Apparently, the accompanying drawings in the following description show merely some embodiments of the present invention, and a person of ordinary skill in the art may still derive other drawings according to these accompanying drawings without creative efforts.

FIG. 1A is a left view of the device, FIG. 1B is a right view of the device, FIG.

1C is a top view of the device, and FIG. 1D is an enlarged view of a part of the top view shown in FIG. 1C;

FIG. 2A is a left view of the heat dissipating device, FIG. 2B is a right view of the heat dissipating device, and FIG. 2C is a top view of the heat dissipating device;

FIG. 4A is a left view of a heat dissipating device, FIG. 4B is a right view of the heat dissipating device, and FIG. 4C is a top view of the heat dissipating device;

FIG. 5A is a left view of a heat dissipating device, FIG. 5B is a right view of the heat dissipating device, and FIG. 5C is a front view of the heat dissipating device;

FIG. 6A is a left view of the heat dissipating device, FIG. 6B is a right view of the heat dissipating device, and FIG. 6C is a front view of the heat dissipating device;

FIG. 8A is a left view of a heat dissipating device, FIG. 8B is a right view of the heat dissipating device, and FIG. 8C is a front view of the heat dissipating device;

FIG. 9A is a left view of a heat dissipating device, FIG. 9B is a right view of the heat dissipating device, and FIG. 9C is a front view of the heat dissipating device; FIG. 10A is a left view of a heat dissipating device, FIG. 10B is a right view of the heat dissipating device, and FIG. 10C is a top view of the heat dissipating device.

DETAILED DESCRIPTION

The following clearly describes the technical solutions in the embodiments of the present invention with reference to the accompanying drawings in the embodiments of the present invention. Apparently, the embodiments to be described are merely a part rather than all of the embodiments of the present invention. All other embodiments obtained by a person of ordinary skill in the art based on the embodiments of the present invention without creative efforts shall fall within the protection scope of the present invention.

Figure 1A:
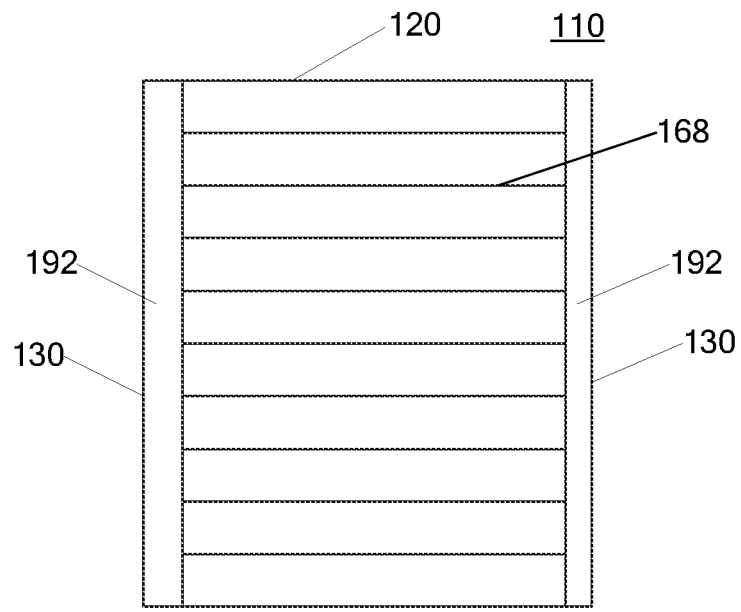
FIG. 1A to FIG. 1D are schematic structural diagrams of a heat dissipating device of a blade server according to an embodiment of the present invention, where
Figure 1B:
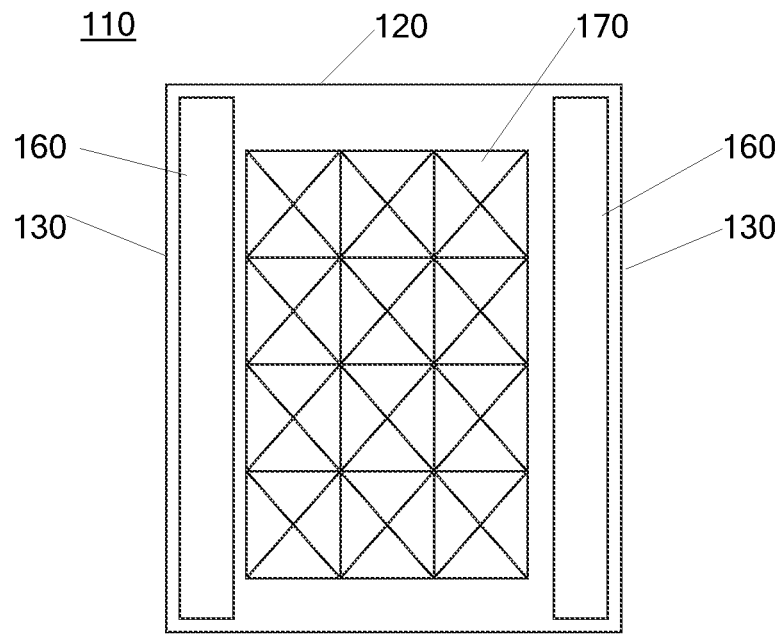
Figure 1C:
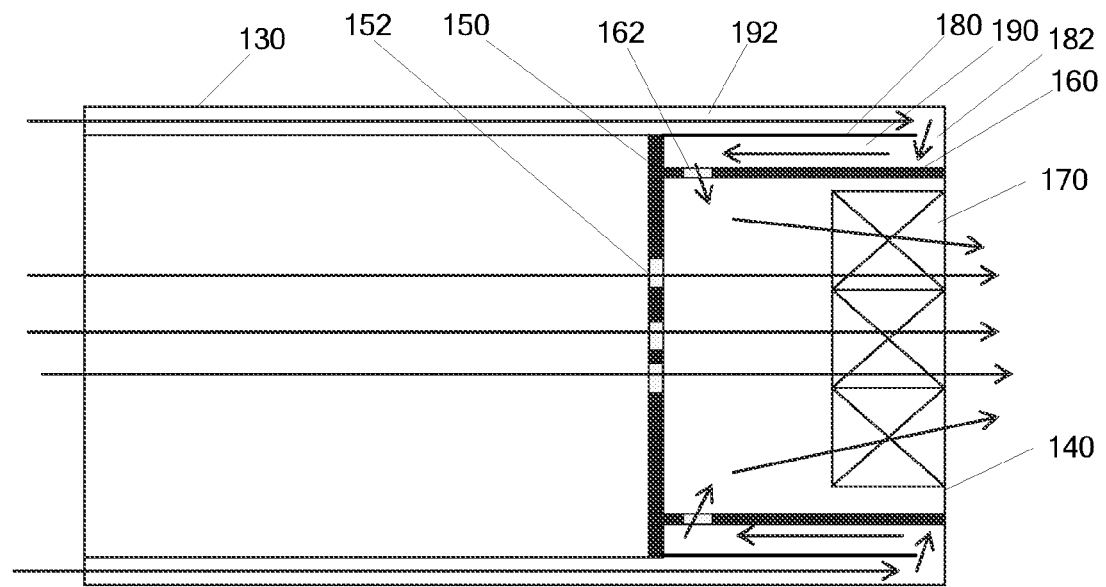
Figure 1D:
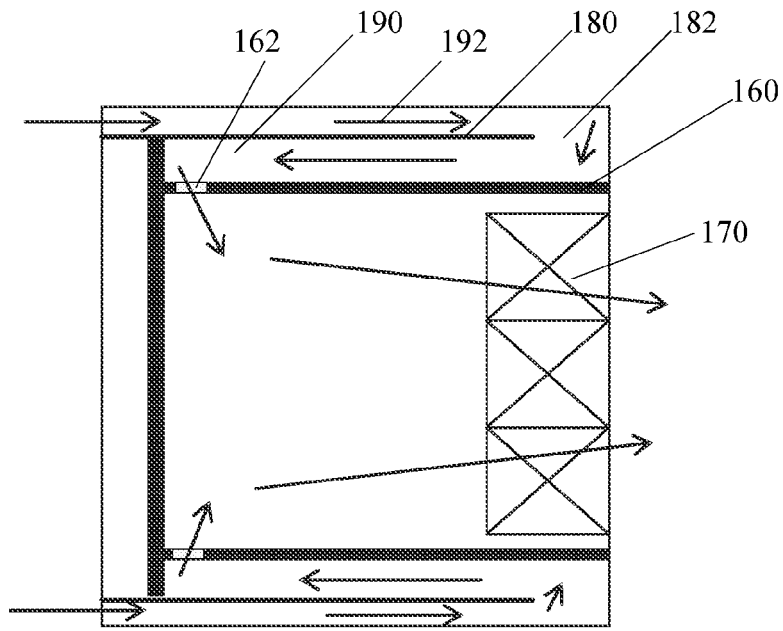

FIG. 1A to FIG. 1D are schematic structural diagrams of a heat dissipating device used for a blade server according to an embodiment of the present invention, where FIG. 1A is a left view of the device, FIG. 1B is a right view of the device, FIG. 1C is a top view of the device, and FIG. 1D is an enlarged view of a part of the top view shown in FIG. 1C.

It can be seen in combination with FIG. 1A to FIG. 1C that, a heat dissipating device according to this embodiment of the present invention includes a chassis 110. The chassis 110 includes horizontal wall panels 120, vertical wall panels 130, and a rear wall panel 140.

The horizontal wall panels 120 of the chassis 110 refer to wall panels that form a top and a bottom of the chassis 110, the vertical wall panels 130 refer to wall panels that form a left side and a right side of the chassis 110, and the rear wall panel 140 refers to a rear-side wall panel of the chassis (the rear-side wall panel may be only a small part, and does not need to completely cover a rear side). According to this embodiment of the present invention, a front panel may be disposed for the chassis 110 as required, or no front panel is disposed so as to facilitate installation of a front board 168.

In this embodiment, a separate air duct is formed on both the left side and the right side (or formed on only one side) of the chassis to dissipate heat of a rear board. Convection air in the air duct does not pass the front board but the air duct is separately formed, so that the heat of the rear board may be more effectively dissipated (The air duct does not pass the front board, and a temperature of the air in the air duct does not rise because of passing a functional module requiring heat dissipation on the front board).

There are multiple manners of forming an air duct, for example, utilizing some air ducting partition plates or utilizing various wall panels (the horizontal wall panels, the vertical wall panels, the rear wall panel, and the like) of the chassis. In this embodiment and the following embodiments, various forming methods are introduced.

In addition, when there are multiple rear boards on one side of the chassis, in order to form an effective air duct, a manner of drilling holes at both ends of one rear board and drilling holes at one end of another rear board may be used to form the effective heat dissipating air duct (such as an embodiment shown in FIG. 6C); or a manner of forming a rear part (close to a fan side) of the chassis into a trough cover may be used for implementation (such as an embodiment shown in FIG. 3), so that the two boards may have a same hole drilling manner to facilitate unified manufacturing. These methods are also specifically introduced in the following embodiments.

The following describes in detail an implementation of this embodiment. Specifically, the heat dissipating device in this embodiment includes: a chassis 110, a backplane 150, at least one rear board 160, and at least one fan 170, where: the chassis 110 includes horizontal wall panels 120, vertical wall panels 130, and a rear wall panel 140; the backplane 150 is disposed in the chassis 110, and configured to connect to a front board 168 inserted from the front of the chassis 110 and the rear board 160 inserted from the back of the chassis 110; the fan 170 is disposed in a rear part of the chassis 110, and configured to dissipate heat out of the chassis 110; the backplane 150 has one or more first hole areas 152, so that under an effect of the fan 170, heat generated by the front board 168 is discharged out of the chassis 110 through the first hole area 152 after passing the backplane 150 and the fan 170; and the chassis 110 includes one or more partition plates 180; the rear board 160 includes one or more second hole areas 162; and the partition plate 180, the horizontal wall panels 120, the vertical wall panels 130, the rear wall panel 140, the backplane 150, and the rear board 160 form a cooling air duct that does not pass the front board 168, so that under the effect of the fan 170, a cooling air flow is discharged out of the chassis 110 after passing the rear board 160, the second hole area 162, and the fan 170, so as to implement heat dissipation for a functional module on the rear board 160. Here, it should be noted that, the term "rear side" is used in this specification to represent a side close to the rear wall panel, while the term "front side" represents a side opposite to the "rear side" in this specification; the term "horizontal" is used in this specification to represent a direction parallel to a plane on which the chassis is placed, while the term "vertical" is used in this specification to represent a direction vertical to the placement plane; the term "top" in this specification refers to a side far away from the placement plane of the chassis in a vertical direction, while the term "bottom" in this specification refers to a side close to the placement plane of the chassis; the term "left side" in this specification refers to a left side when the rear wall panel of the chassis placed on the plane is faced, while the term "right side" in this specification refers to a right side in this case; and the term "parallel" is used in this specification to indicate that two components are roughly parallel to each other, and does not mean that the two are absolutely parallel to each other, and a certain error may exist between the two or the two may form a certain angle as long as a certain gap exists between the two.

In this embodiment of the present invention, optionally the heat dissipating device of a blade server includes the front board 168 and the front panel.

The following specifically describes an instance of the heat dissipating device in combination with FIG. 1A to FIG. 1D.

In the left view shown in FIG. 1A, front boards 168 are spaced away from each other and horizontally plugged on the backplane 150 (shown in FIG. 1C). Air intake channels 192 of certain widths are reserved between two ends of the front boards 168 and the vertical wall panels 130 on two sides. A person skilled in the art may select widths of the air intake channels, such as a size of 1 centimeter (cm) or 2 cm, according to an actual situation.

In the right view shown in FIG. 1B, the rear boards 160 are vertically plugged on the backplane 150 (shown in FIG. 1C) and roughly parallel to the vertical wall panels 130 on two sides. In this example, the rear boards 160 are disposed on the two sides and close to the vertical wall panels 130. Multiple fans 170 are in an array form and roughly disposed in a middle area of the rear wall panel 140. In this embodiment, multiple functional modules not indicated in the figures, such as an input/output (I/O) port module and an optical module, are installed on a side which is of the rear board 160 and is away from the fan 170, that is, on a side opposite to the vertical wall panel 130.

As shown in FIG. 1C, one or more first hole areas 152 are provided in areas that correspond to gaps between the front boards 168 on the backplane 150, so that a functional module on the front boards 168 is cooled when the fans 170 are working. In the following embodiments, all manners of cooling the front boards 162 adopt such structure. For simplicity, a cooling structure of the front boards 168 is not repeatedly described in the following.

The partition plate 180 and the rear board 160 are spaced from each other and roughly parallel to each other. The partition plate 180 is disposed between the rear board 160 and the vertical wall panel 130, and the partition plate 180 is farther away from the fan 170 than the rear board 160. That is, the partition plate 180 is closer to the vertical wall panels 130 on the two sides. In this way, a cooling air duct 190 of a preset width, such as a 2 cm width, is formed between the partition plate 180 and the rear board 160, while an air intake channel 192 is formed between the partition plate 180 and the vertical wall panel 130. A person skilled in the art should understand that a width of the cooling air duct 190 may be determined according to a height of a functional module installed on the rear board 160. As is shown in FIG. 1D more clearly, the partition plate 180 extends backward to a position near the rear wall panel 140, and a partition gap 182 of a preset width, such as a partition gap of a 2 cm width, is formed between a rear end of the partition plate 180 and the rear wall panel 140, so that a cooling air flow that enters from the air intake channel 192 may enter the cooling air duct 190 through the partition gap 182. According to an optional embodiment of the present invention, the partition plate 180 may extend forward to a front side of the chassis 110 or a position near the front side of the chassis 110, so that the air intake channel 192 is more effectively confined. One or more second hole areas 162 are provided at an end which is of the rear board 160 and is close to the backplane 150, so that a cooling air flow enters a middle space of the chassis from the cooling air duct 190 through the second hole area 162 and is then discharged out of the chassis 110 by the fan 170.

When the heat dissipating device shown in FIG. 1A to FIG. 1C is working, the fan 170 acts and draws air out of the chassis 110, so that a cooling air flow enters the cooling air duct 190 from the front panel through the air intake channel 192 and the partition gap 182. In the cooling air duct 190, the cooling air flow is subject to structural limitations of the partition plate 180 and the rear board 160, and traverses the functional modules installed on the rear board 160 while being roughly parallel to the rear board 60 to achieve a cooling effect on these functional modules, then the cooling air flow enters the middle space of the chassis 110 through the second hole area 162 on the rear board 160, and is finally discharged out of the chassis 110 by the fan 170. In this case, under the effect of the fan 170, the cooling air flow first passes a side on which functional modules requiring heat dissipation are disposed on the rear board 160, then passes the second hole area 162 and the fan 170, and is discharged out of the chassis 110.

According to this embodiment of the present invention, an optical module with a high heat dissipation requirement may be installed on a rear part of the rear board 160, that is, a part which is close to the fan 170 and is far away from the backplane 150, so that when passing the side on which the functional module is disposed on the rear board 160, the cooling air flow first passes the optical module to dissipate heat of the optical module, and then dissipates heat of another functional module requiring heat dissipation on the rear board 160.

Generally speaking, a length of the rear board 160 is relatively short, and therefore, a length of the cooling air duct 190 is also relatively short. Therefore, the heat dissipating device of a blade server shown in FIG. 1A to 1D has a simple air duct structure and a good cooling effect.

Figure 2A:
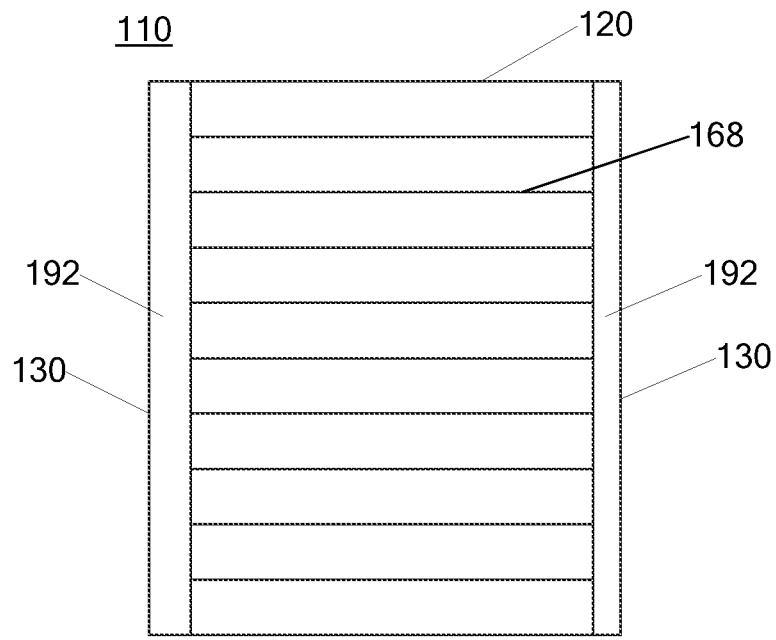
FIG. 2A to FIG. 2C are schematic structural diagrams of a heat dissipating device of a blade server according to another embodiment of the present invention, where
Figure 2B:
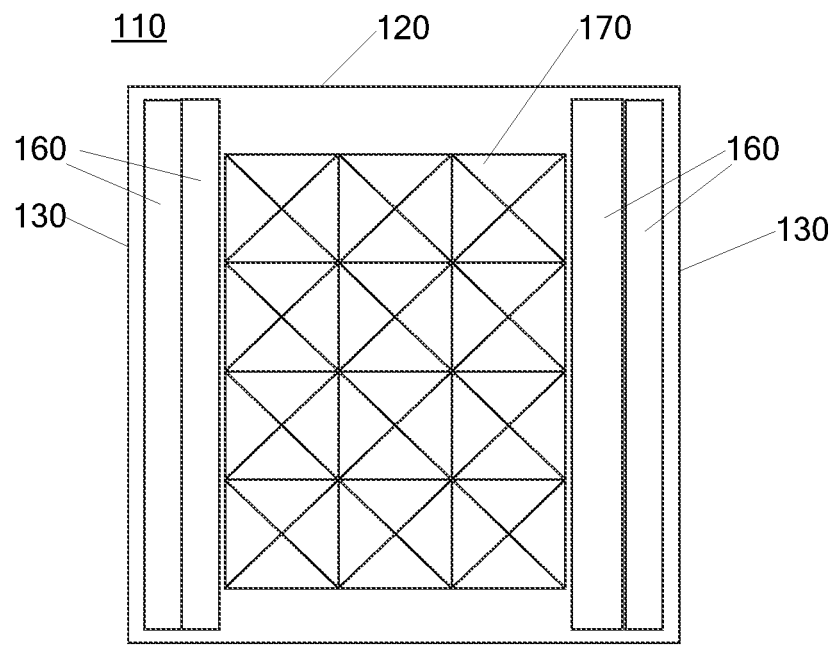
Figure 2C:
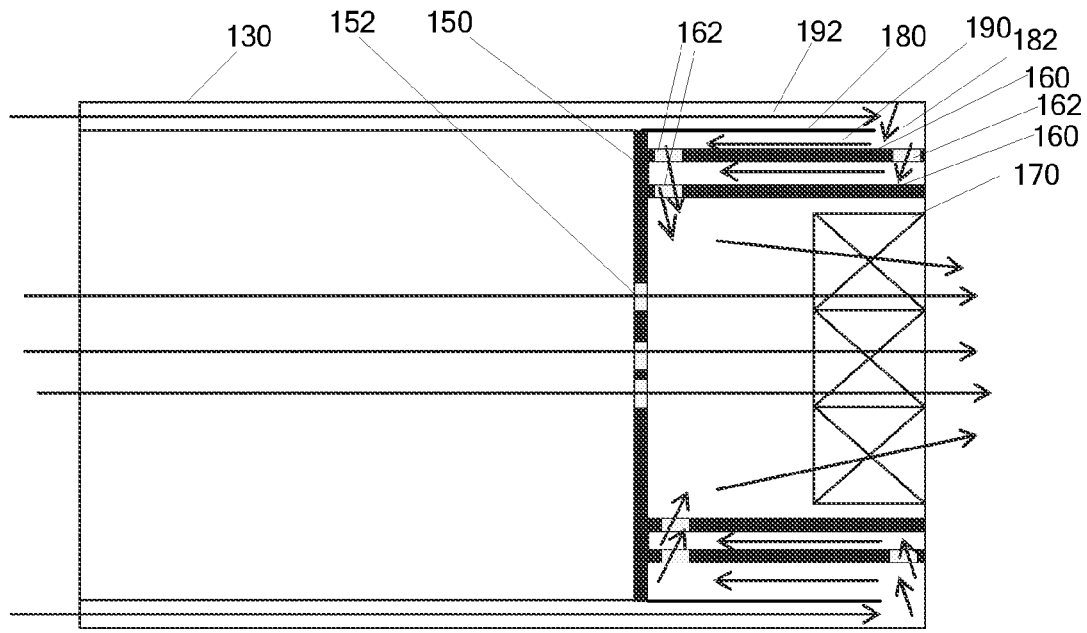

FIG. 2A to FIG. 2C are schematic structural diagrams of a heat dissipating device of a blade server according to a further embodiment of the present invention, where FIG. 2A is a left view of the heat dissipating device, FIG. 2B is a right view of the heat dissipating device, and FIG. 2C is a top view of the heat dissipating device. A difference between the embodiment of the present invention shown in FIG. 2A to FIG. 2C and the embodiment shown in FIG. 1A to FIG. 1D lies in that: In the embodiment shown in FIG. 2A to FIG. 2C, there are multiple rear boards 160, for example, four rear boards are parallel to each other and vertically plugged side by side on the backplane 150 in a form of two rear boards on each side, and are spaced away from each other to form multiple parallel cooling air ducts 190. Here, an upper part shown in FIG. 2C is taken as an example for description. A person skilled in the art may understand that the rear boards 160 and the partition plates 180 are disposed roughly symmetrically along a longitudinal axis of the chassis. A functional module on each rear board 160 is installed on a side which is of each rear board 160 and is far away from the fan 170. In this case, on a rear board 160 closest to the fan 170, that is, a rear board 160 farthest away from the partition plate 180 (hereinafter referred to as a second rear board 160), one or more second hole areas 162 are provided at an end close to the backplane 150; on a remaining rear board 160 (hereinafter referred to as a first rear board 160), one or more second hole areas 162 are provided at a rear end close to the rear wall panel 140 and at a front end close to the backplane 150, so that a cooling air flow from the air intake channel 192 may enter the multiple cooling air ducts 190, and in the cooling air ducts 190 confined between the multiple rear boards 160 and the partition plate 180, simultaneously traverses a functional module on each rear board 160 to simultaneously cool the functional module on the multiple rear boards 160. A person skilled in the art should understand that the number of rear boards 160 is not limited in this embodiment of the present invention. A person skilled in the art may dispose a different number of rear boards 160 according to a specific application requirement, and utilize the partition plate 180 to form multiple cooling air ducts 190 which are between the rear boards 160 and between the rear boards 160 and the partition plate 180 and are parallel to the rear boards 160. With the foregoing disposing, after the cooling air flow arrives at the second hole area 162 at the rear end of the first rear board 160 under the effect of the fan 170, one part of the cooling air flow passes a side on which a functional module requiring heat dissipation is disposed on the first rear board 160 so as to dissipate heat of the functional module, and is discharged out of the chassis 110 by the fan 170 after passing the second hole area 162 on the second rear board 160; and the other part of the cooling air flow arrives at a side on which a functional module requiring heat dissipation is disposed on the second rear board 160 so as to dissipate heat of the functional module, and is discharged out of the chassis by the fan after passing the second hole area 162 at the front end of the second rear board 160.

Figure 3:
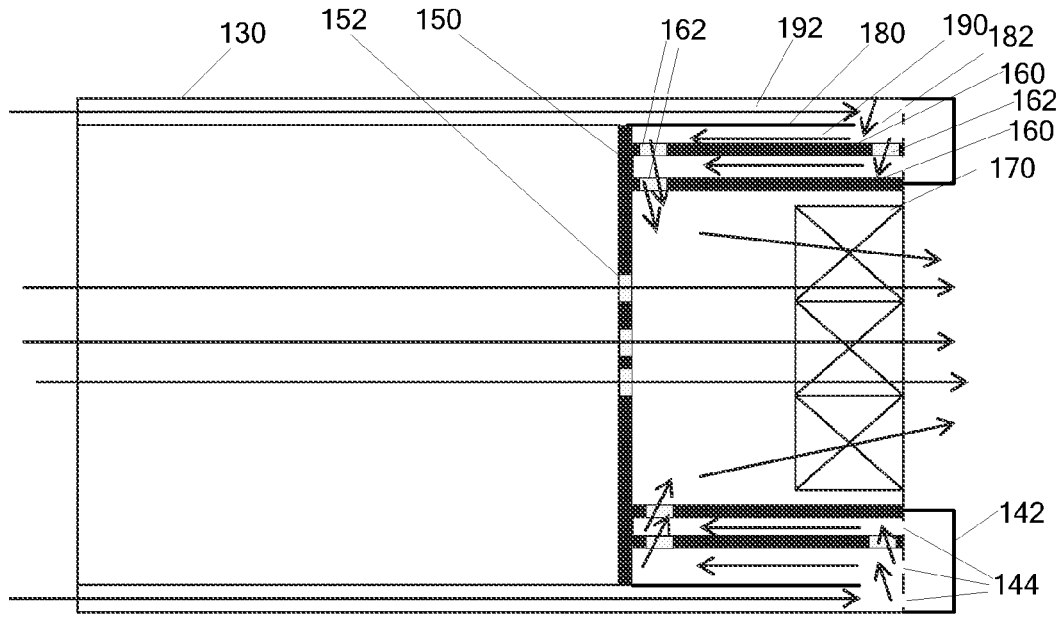
FIG. 3 is a top view of a further improved solution according to an embodiment of the present invention.

FIG. 3 is a top view of a further improved solution according to an embodiment of the present invention. In the embodiment shown in FIG. 3, a heat dissipating device may include a protrusive trough cover 142, where the trough cover 142 is connected to a rear wall panel 140 and covers areas that correspond to an air intake channel 192 and cooling air ducts 190 and are on the rear wall panel 140 in a sealing manner. In this case, notches 144 used for ventilation are provided on areas of the rear wall panel 140 that are covered by the protrusive trough cover 142 on the rear wall panel 140. The notches 144 respectively correspond to the air intake channel 192 and the cooling air ducts 190, so that a cooling air flow from the air intake channel 192 enters, through a notch 144 that corresponds to the air intake channel 192, a trough area in the trough cover 142, and then enters each cooling air duct 190 through notches 144 that correspond to the cooling air ducts 190. In this case, a second hole area 162 provided at a rear end of a first rear board 160 may also be omitted. In this way, all the rear boards 160 have a same structure, which facilitates unified manufacturing.

Alternatively, the rear wall panel 140, vertical wall panels 130, and horizontal wall panels 120 in a chassis 110 form the protrusive trough cover 142, the trough cover 142 covers a rear part of the chassis 110 in a sealing manner, and the rear part of the chassis is a part which is close to a fan 170 and is away from the backplane 150.

In this case, after arriving at the trough cover 142 under the effect of the fan 170, the cooling air flow respectively passes a side on which a functional module requiring heat dissipation is disposed on the first rear board 160 and a side on which a functional module requiring heat dissipation is disposed on a second rear board 160, flows out respectively from the second hole area 162 at a front end of the first rear board 160 and the second hole area 162 at a front end of the second rear board 160, and is discharged out of the chassis by the fan 170. The protrusive trough cover 142 is disposed to help cover ports and cables, so that an overall structure of the chassis is neat and nice-looking and maintenance is facilitated.

Figure 4A:
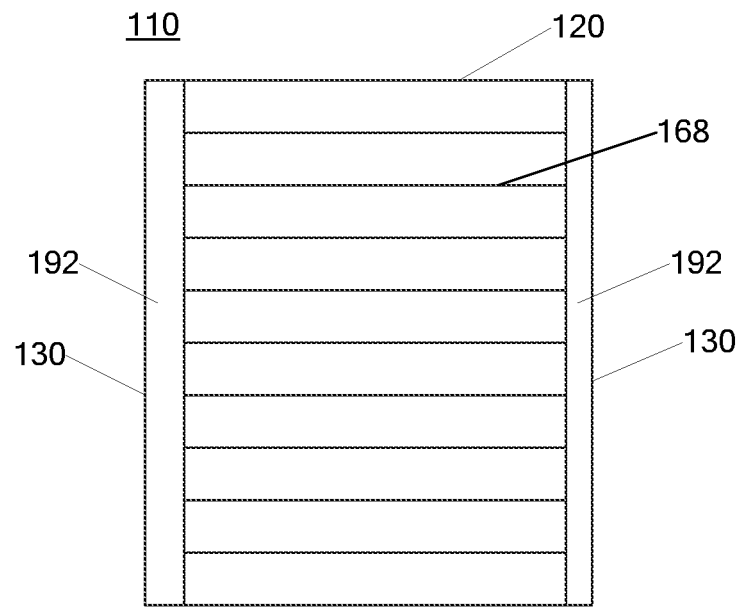
FIG. 4A to FIG. 4C are schematic structural diagrams of a further improved solution according to an embodiment of the present invention, where
Figure 4B:
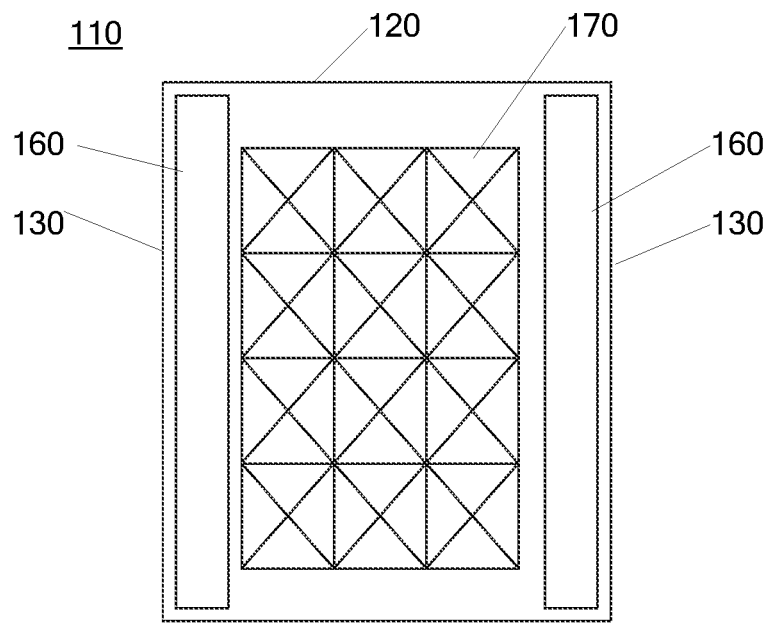
Figure 4C:
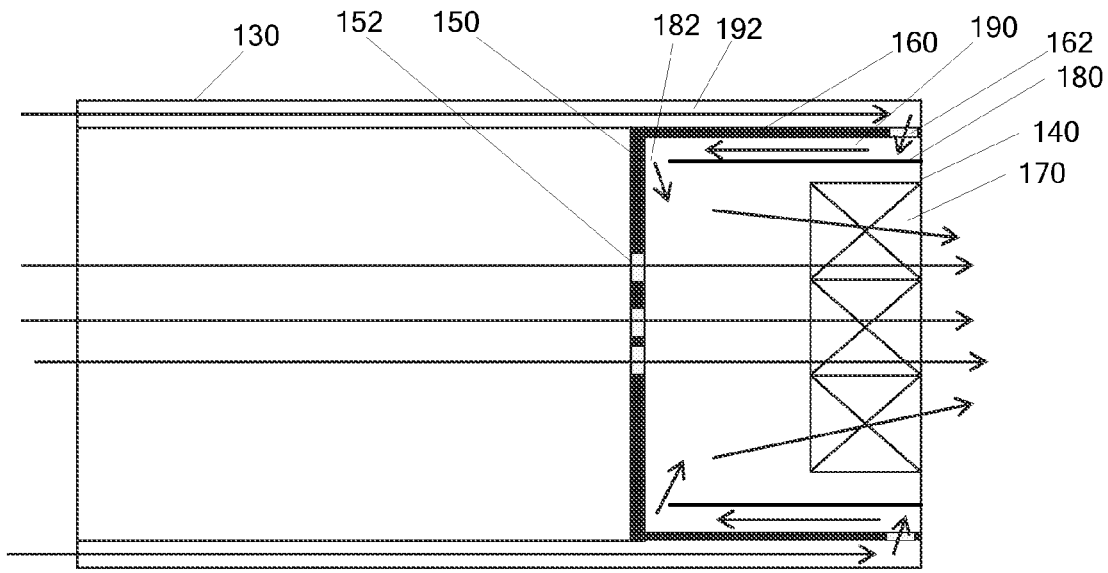

FIG. 4A to FIG. 4C are schematic structural diagrams of a further improved solution according to an embodiment of the present invention, where FIG. 4A is a left view of a heat dissipating device, FIG. 4B is a right view of the heat dissipating device, and FIG. 4C is a top view of the heat dissipating device.

A difference between the embodiment shown in FIG. 4A to FIG. 4C and the embodiments shown in FIG. 1A-FIG. 1C to FIG. 3 lies in that: In the embodiment shown in FIG. 4A to FIG. 4C, a functional module on the rear board 160 is disposed on a side that faces the fan. In this case, an air intake channel 192 is formed between a side on which no functional module is installed on the rear board 160 and a neighboring vertical wall panel 130. In this case, the partition plate 180 is spaced away from the rear board 160 and disposed on a side which is of the rear board 160 and is closer to the fan 170. That is, the partition plate 180 is disposed on a side closer to the middle of the chassis 110 and separated from the rear board 160, and forms a cooling air duct 190 with the rear board 160. For ventilation, if the rear board 160 extends to the rear wall panel 140, one or more second hole areas 162 are provided at an end which is of the rear board 160 and is close to the rear panel 140, so that a cooling air flow from the air intake channel 192 enters the cooling air duct 190 through the second hole area 162. The backplane 150 laterally extends to the rear board 160, so that ends of the backplane 150 are separated from the vertical wall panel 130, and an air intake channel 192 is formed between the rear board 160 and the vertical wall panel 130. In the embodiment shown in FIG. 4A to FIG. 4C, in one case, a rear side of the partition plate 180 extends to the rear wall panel 140, while a front end of the partition plate 180 extends to the backplane 150. In this case, a partition gap 182 used for ventilation is provided at an end which is of the partition plate 180 and is close to the backplane 150, so that the cooling air flow that traverses the functional module along the cooling air duct 190 enters a middle area of the chassis 110 through the partition gap 182, and is then discharged by the fan 170.

In such an embodiment, under the effect of the fan 170, the cooling air flow first passes the side on which no functional module requiring heat dissipation is disposed on the rear board 160, then passes the second hole area 162, further passes a side on which a functional module requiring heat dissipation is disposed on the rear board 160 and the fan 170, and is discharged out of the chassis 110.

Similarly, according to this embodiment of the present invention, an optical module with a high heat dissipation requirement may be installed on a rear part of the rear board 160, that is, a part which is close to the fan 170 and is far away from the backplane 150, so that when passing the side on which the functional module is disposed on the rear board 160, the cooling air flow first passes the optical module to dissipate heat of the optical module, and then dissipates heat of another functional module requiring heat dissipation on the rear board 160.

According to this embodiment of the present invention, the rear boards 160 and the partition plates 180 are disposed roughly symmetrically on two sides inside the chassis 110 along a longitudinal axis of the chassis 110.

Although not indicated in FIG. 4A to FIG. 4C, multiple rear boards 160 spaced away from each other may exist in the embodiment shown in FIG. 4A to FIG. 4C. All functional modules on the multiple rear boards 160 are disposed on the side that faces the fan. The partition plate 180 is disposed farthest away from the vertical wall panel 130 as compared with each rear board 160. That is to say, the partition plate 180 is disposed on one side which is of a rear board 160 closest to the fan 170 among the multiple rear boards 160 and is close to the fan 170. That is, a descending sequence of a distance from the fan is as follows: the vertical wall panel 130, the multiple rear boards 160 spaced away from each other, the partition plate 180, and the fan 170. With such structure, multiple cooling air ducts 190 are formed between the multiple rear boards 160 and between a rear board 160 closest to the partition plate 180 and the partition plate 180. In this case, on a rear board 160 farthest away from the partition plate 180 (hereinafter referred to as a first rear board 160), one or more second hole areas 162 are provided at an end close to the rear wall panel 140; on a remaining rear board 160 (hereinafter referred to as a second rear board 160), one or more second hole areas 162 are provided at a front end close to the backplane 150 and at a rear end close to the rear wall panel 140, so that the cooling air flow from the air intake channel 192 may simultaneously enter the multiple cooling air ducts 190 through each second hole area 162, and in the cooling air ducts 190, simultaneously traverses a functional module on each rear board 160 to simultaneously cool the functional module on the multiple rear boards 160. Same as the embodiments shown in FIG. 1A-FIG. 1C to FIG. 3, the cooling air flow respectively passes the air intake channel 192, the second hole area 162, the cooling air ducts 190, and the partition gap 182; and traverses a functional module on the rear boards 160 along the cooling air ducts 190, thereby avoiding a cascade heating effect generated in a process of cooling the functional module on the rear boards 160 and improving cooling efficiency. In addition, same as the embodiments shown in FIG. 1A-FIG. 1C to FIG. 3, in the embodiment shown in FIG. 4A to FIG. 4C, air ducts have a simple overall structure, thereby facilitating manufacturing and improving the cooling efficiency.

Although not indicated in the figures, a person skilled in the art should understand that in the embodiment shown in FIG. 4A to FIG. 4C, the trough cover 142 shown in FIG. 3 may also be disposed. The trough cover 142 helps cover ports and cables, so that an overall structure of the chassis is neat and nice-looking and maintenance is facilitated.

Although not indicated in the figures, a person skilled in the art should understand that in some application scenarios, the embodiment shown in FIG. 1A to FIG. 1C may be combined with the embodiment shown in FIG. 4A to FIG. 4C. That is, a rear board 160 and a partition plate 180 on one side of the chassis may be disposed according to the embodiment shown in FIG. 1A to FIG. 1C, while a rear board 160 and a partition plate 180 on the other side of the chassis may be disposed according to the embodiment shown in FIG. 4A to FIG. 4C. Such an embodiment also falls within the scope of the embodiments of the present invention.

In the embodiments shown in FIG. 1A-FIG. 1C to FIG. 4A-FIG. 4C, the front board is horizontally plugged on the backplane, while the rear board 160 is vertically plugged on the backplane 150. The embodiments of the present invention are not limited to such structure. In a further improved solution according to an embodiment of the present invention, the front board 168 may also be vertically plugged on the backplane, while the horizontal board 160 is horizontally plugged on the backplane 150. In this case, air intake channels may be disposed at the top and the bottom of the chassis 110.

Figure 5A:
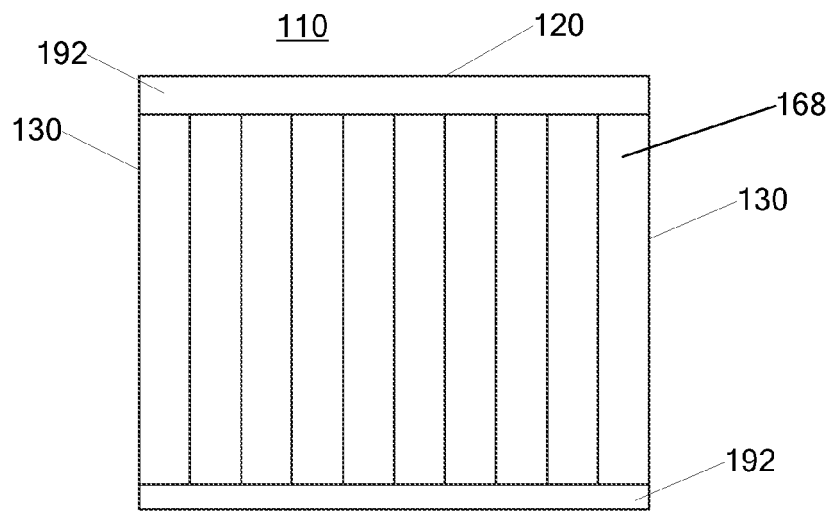
FIG. 5A to FIG. 5C are schematic structural diagrams of a further improved solution according to an embodiment of the present invention, where
Figure 5B:
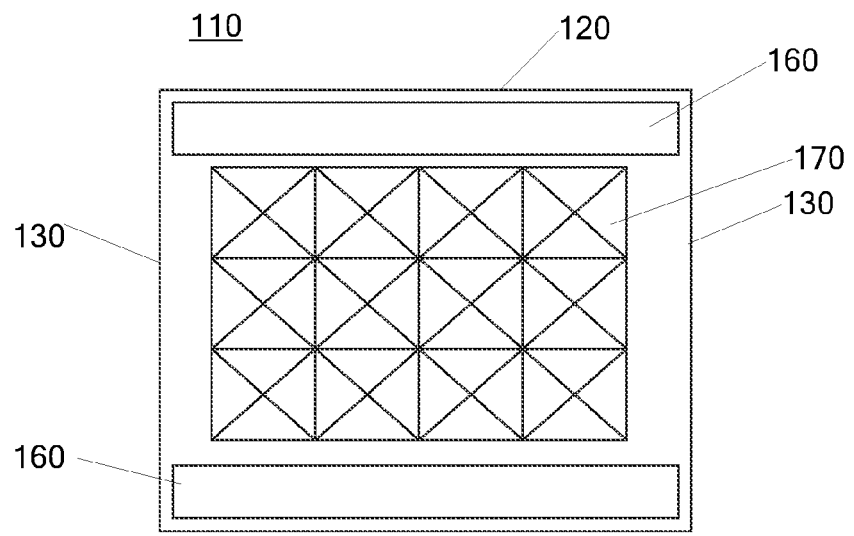
Figure 5C:
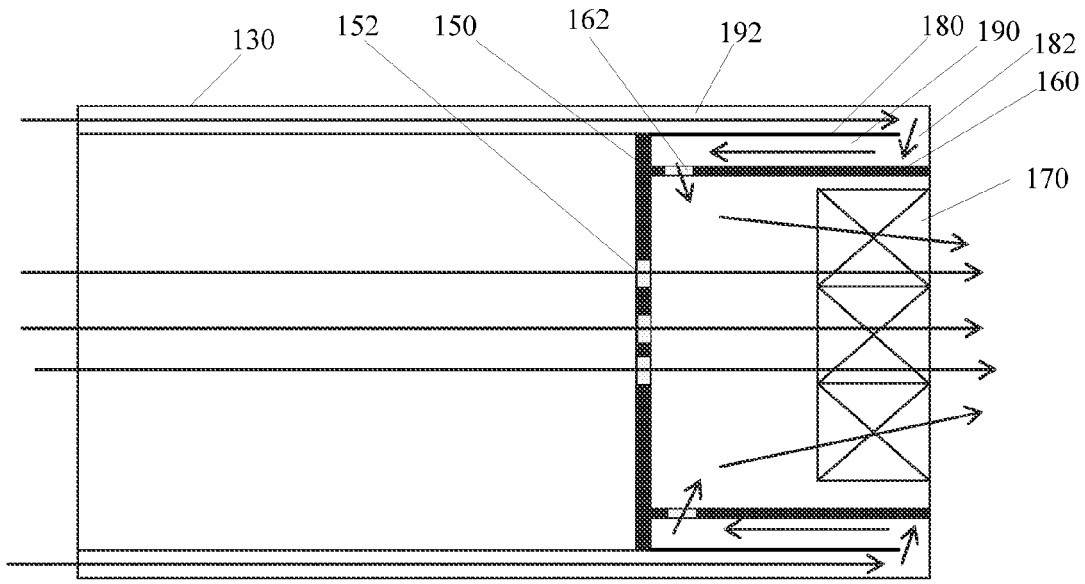

FIG. 5A to FIG. 5C are schematic structural diagrams of a further improved solution according to an embodiment of the present invention, and show a case in which front boards are vertically plugged on a backplane, while rear boards are plugged on the backplane, and air intake channels are disposed at the top and the bottom of a chassis. FIG. 5A is a left view of a heat dissipating device, FIG. 5B is a right view of the heat dissipating device, and FIG. 5C is a front view of the heat dissipating device.

In the left view shown in FIG. 5A, front boards 168 are spaced away from each other and vertically plugged on a backplane 150. Air intake channels 192 of certain widths are reserved between two ends of the front boards 168 and horizontal wall panels 120 at the top and the bottom. A person skilled in the art may select widths of the air intake channels, such as a size of 1 cm or 2 cm, according to an actual situation.

In the right view shown in FIG. 5B, rear boards 160 are disposed near the horizontal wall panels 120 and roughly parallel to the horizontal wall panels 120, and the rear boards 160 are horizontally plugged on the backplane 150. Multiple fans 170 are in an array form and roughly disposed in a middle area of a rear wall panel 140. In a current embodiment, multiple functional modules not indicated in the figures, such as an I/O port module and an optical module, are installed on a side which is of the rear board 160 and is away from the fan 170.

As shown in FIG. 5C, a partition plate 180 is disposed between the rear board 160 and the horizontal wall panel 120, and is parallel to the rear board 160 and the horizontal wall panel 120; and the partition plate 180 is spaced away from the rear board 160, and is farther away from the fan 170 than the rear board 160. That is, the partition plate 180 is closer to the horizontal wall panels 120 at the top and at the bottom. In this way, a cooling air duct 190 of a preset width, such as a 2 cm width, is formed between the partition plate 180 and the rear board 160, while an air intake channel 192 is formed between the partition plate 180 and the horizontal wall panel 120, so that ends of the backplane are separated from the horizontal wall panels. A person skilled in the art should understand that a width of the cooling air duct 190 may be determined according to a height of a functional module installed on the rear board 160. As shown in FIG. 5C, the partition plate 180 extends backward to a position near the rear wall panel 140, and a partition gap 182 of a preset width, such as a partition gap of a 2 cm width, is formed between a rear end of the partition plate 180 and the rear wall panel 140, so that a cooling air flow that enters from the air intake channel 192 may enter the cooling air duct 190 through the partition gap 182. According to an optional embodiment of the present invention, the partition plate 180 may extend forward to a front side of the chassis 110 or a position near the front side of the chassis 110, so that the air intake channel 192 is more effectively confined. One or more second hole areas 162 may be provided at an end which is of the rear board 160 and is close to the backplane 150, so that a cooling air flow from the air intake channel 192 passes the partition gap 182, traverses the functional module on the rear board 160 along the cooling air duct 190, enters a middle space of the chassis through the second hole area 162 on the rear board 160, and is then discharged out of the chassis 110 by the fan 170.

When the heat dissipating device shown in FIG. 5A to FIG. 5C is working, the fan 170 acts and draws air out of the chassis 110, so that a cooling air flow enters the cooling air duct 190 from a front panel through the air intake channel 192 and the partition gap 182. In the cooling air duct 190, the cooling air flow is subject to structural limitations of the partition plate 180 and the rear board 160, and traverses the functional modules installed on the rear board 160 to achieve a cooling effect on these functional modules, then the cooling air flow enters the middle space of the chassis 110 through the second hole area 162 on the rear board 160, and is finally discharged out of the chassis 110 by the fan 170.

In this case, under the effect of the fan 170, the cooling air flow first passes a side on which a functional module requiring heat dissipation is disposed on the rear board 160, then passes the second hole area 162 and the fan 170, and is discharged out of the chassis 110.

According to this embodiment of the present invention, an optical module with a high heat dissipation requirement may be installed on a rear part of the rear board 160, that is, a part which is close to the fan 170 and is far away from the backplane 150, so that when passing the side on which the functional module is disposed on the rear board 160, the cooling air flow first passes the optical module to dissipate heat of the optical module, and then dissipates heat of another functional module requiring heat dissipation on the rear board 160.

Although not indicated in the figures, a person skilled in the art should understand that in the embodiment shown in FIG. 5A to FIG. 5C, the trough cover 142 shown in FIG. 3 may also be disposed. The trough cover 142 helps cover ports and cables, so that an overall structure of the chassis is neat and nice-looking and maintenance is facilitated. In this case, the trough covers 142 are horizontally disposed in an upper part and a lower part of the rear wall panel 140, and correspond to the air intake channels 192 and the cooling air ducts 190.

According to this embodiment of the present invention, the rear boards 160 and the partition plates 180 are disposed roughly symmetrically at the top and the bottom of the chassis 110 along a longitudinal axis of the chassis 110. In a case that the trough covers 142 exist, accordingly the trough covers 142 are also symmetrically disposed.

Figure 6A:
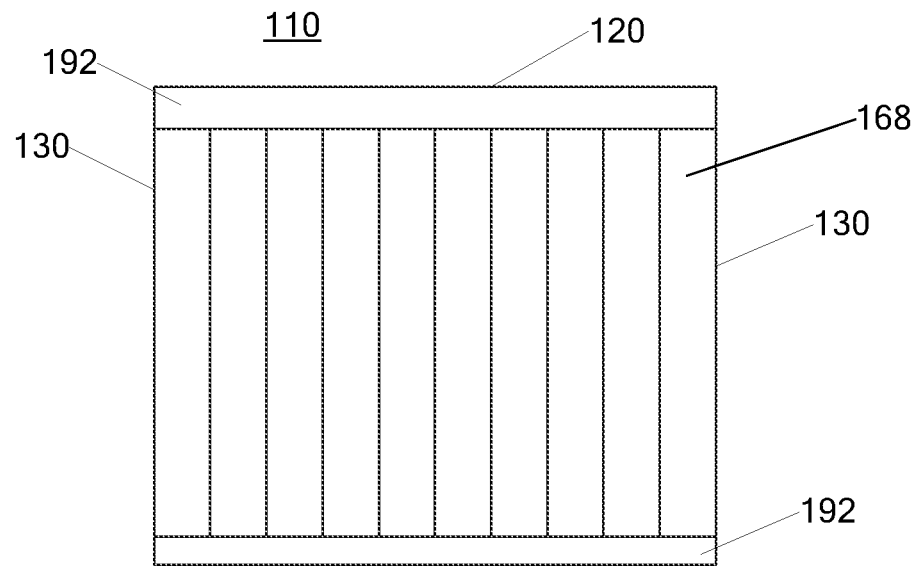
FIG. 6A to FIG. 6C are schematic structural diagrams of a heat dissipating device of a blade server according to a further embodiment of the present invention, where
Figure 6B:
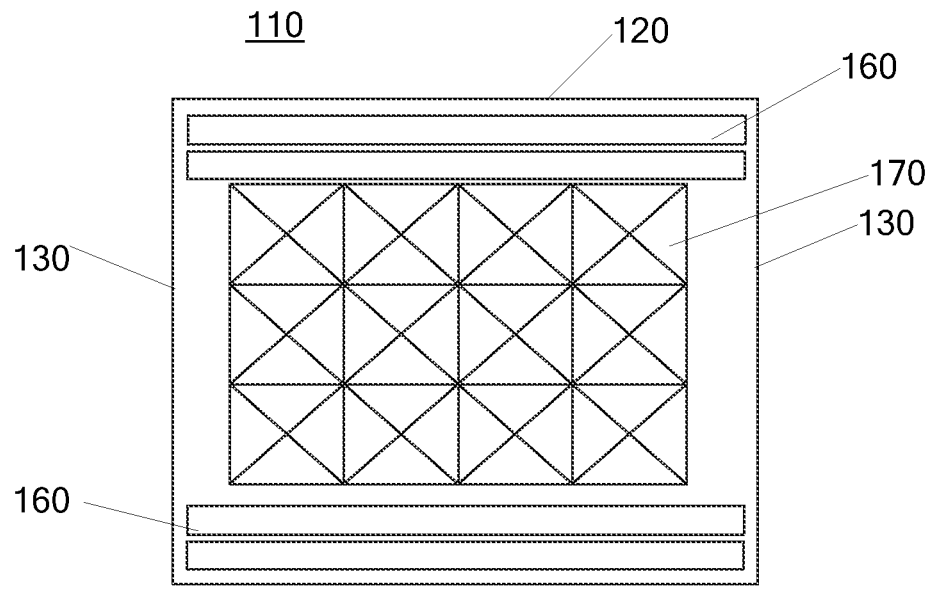
Figure 6C:
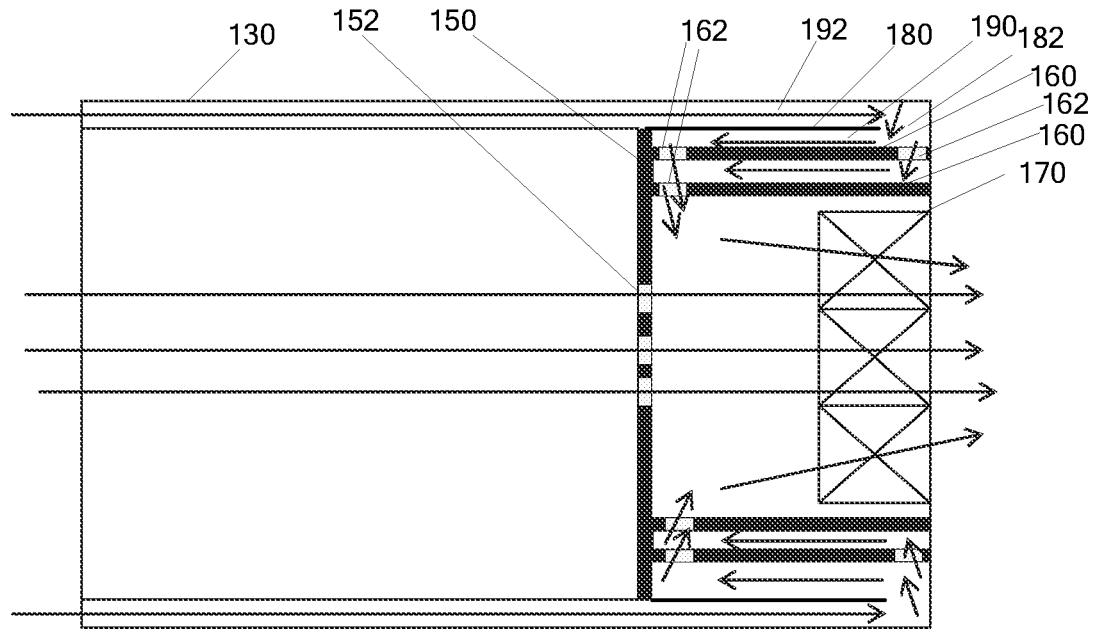

FIG. 6A to FIG. 6C are schematic structural diagrams of a heat dissipating device according to a further embodiment of the present invention, where FIG. 6A is a left view of the heat dissipating device, FIG. 6B is a right view of the heat dissipating device, and FIG. 6C is a front view of the heat dissipating device. A difference between the embodiment of the present invention shown in FIG. 6A to FIG. 6C and the embodiment shown in FIG. 5A to FIG. 5C lies in that: In the embodiment shown in FIG. 6A to FIG. 6C, there are multiple rear boards 160, for example, four rear boards are parallel to each other and horizontally plugged side by side on the backplane 150 in a form of two rear boards in an upper part and two rear boards in a lower part, and are spaced away from each other to form multiple cooling air ducts 190 that are roughly parallel to each other. A functional module on each rear board 160 is installed on a side which is of each rear board 160 and is far away from the fan 170. In this case, on a rear board 160 closest to the fan 170, that is, a rear board 160 farthest away from the partition plate 180 (hereinafter referred to as a second rear board 160), one or more second hole areas 162 are provided at a front end close to the backplane 150; on a remaining rear board 160 (hereinafter referred to as a first rear board 160), one or more second hole areas 162 are provided at a rear end close to the rear wall panel 140 and at a front end close to the backplane 150, so that a cooling air flow from the air intake channel 192 may enter the multiple cooling air ducts 190, and in the cooling air ducts 190 confined between the multiple rear boards 160 and the partition plate 180, simultaneously traverses a functional module on each rear board 160 to simultaneously cool the functional module on the multiple rear boards 160. A person skilled in the art should understand that the number of rear boards 160 is not limited in this embodiment of the present invention. A person skilled in the art may dispose a different number of rear boards 160 according to a specific application requirement, and utilize the partition plate 180 to form multiple cooling air ducts 190 which are between the rear boards 160 and between the rear boards 160 and the partition plate 180 and are parallel to the rear boards 160. With the foregoing disposing, after the cooling air flow arrives at the second hole area 162 at the rear end of the first rear board 160 under the effect of the fan 170, one part of the cooling air flow passes a side on which a functional module requiring heat dissipation is disposed on the first rear board 160 so as to dissipate heat of the functional module, and is discharged out of the chassis 110 by the fan 170 after passing the second hole area 162 on the second rear board 160; and the other part of the cooling air flow arrives at a side on which a functional module requiring heat dissipation is disposed on the second rear board 160 so as to dissipate heat of the functional module, and is discharged out of the chassis by the fan after passing the second hole area 162 at the front end of the second rear board 160.

Figure 7:
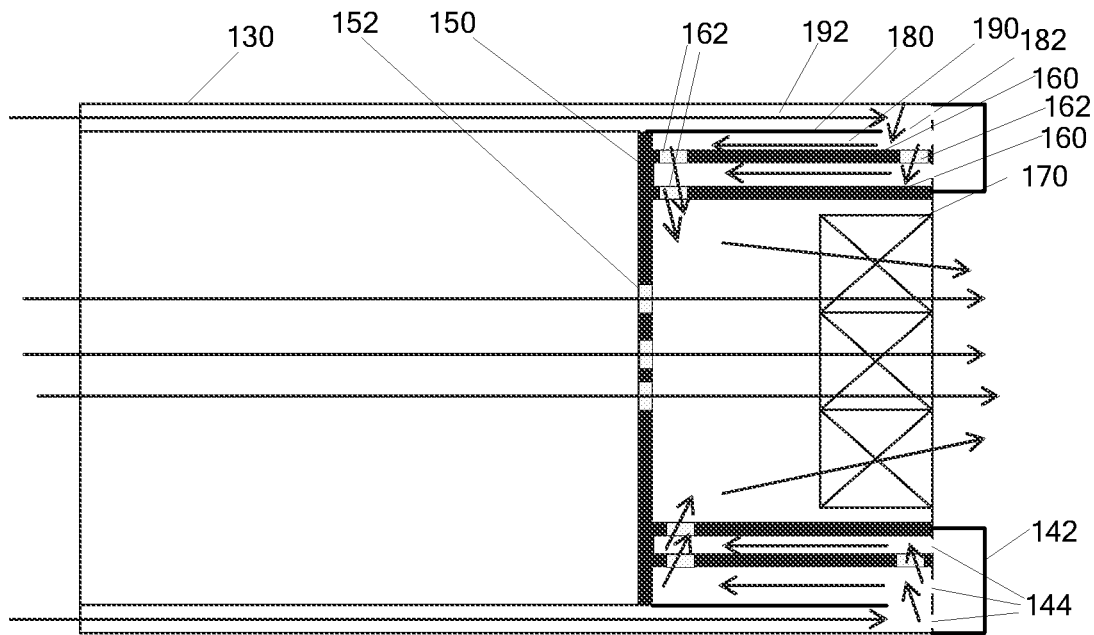
FIG. 7 is a front view of a further improved solution according to an embodiment of the present invention.

FIG. 7 is a front view of a further improved solution according to an embodiment of the present invention. In the embodiment shown in FIG. 7, a heat dissipating device may include a protrusive trough cover 142, where the trough cover 142 covers a rear side of a rear wall panel 140 in a sealing manner, and covers areas that correspond to an air intake channel 192 and cooling air ducts 190 and are on the rear wall panel 140. In this case, notches 144 used for ventilation are provided on areas that are covered by the protrusive trough cover 142 on the rear wall panel 140. The notches respectively correspond to the air intake channel 192 and the cooling air ducts 190, so that a cooling air flow from the air intake channel 192 enters, through a notch 144 that corresponds to the air intake channel 192, a trough area in the trough cover 142, and then enters each cooling air duct 190 through notches 144 that correspond to the cooling air ducts 190. In this case, a second hole area 162 provided at a rear end of a first rear board 160 may also be omitted.

Alternatively, the rear wall panel 140, vertical wall panels 130, and horizontal wall panels 120 in a chassis 110 form the protrusive trough cover 142, the trough cover 142 covers a rear part of the chassis 110 in a sealing manner, and the rear part of the chassis is a part which is close to a fan 170 and is away from the backplane 150.

In this case, after arriving at the trough cover 142 under the effect of the fan 170, the cooling air flow respectively passes a side on which a functional module requiring heat dissipation is disposed on the first rear board 160 and a side on which a functional module requiring heat dissipation is disposed on a second rear board 160, flows out respectively from the second hole area 162 at a front end of the first rear board 160 and the second hole area 162 at a front end of the second rear board 160, and is discharged out of the chassis by the fan 170. The protrusive trough cover 142 is disposed to help cover ports and cables, so that an overall structure of the chassis is neat and nice-looking and maintenance is facilitated.

Figure 8A:
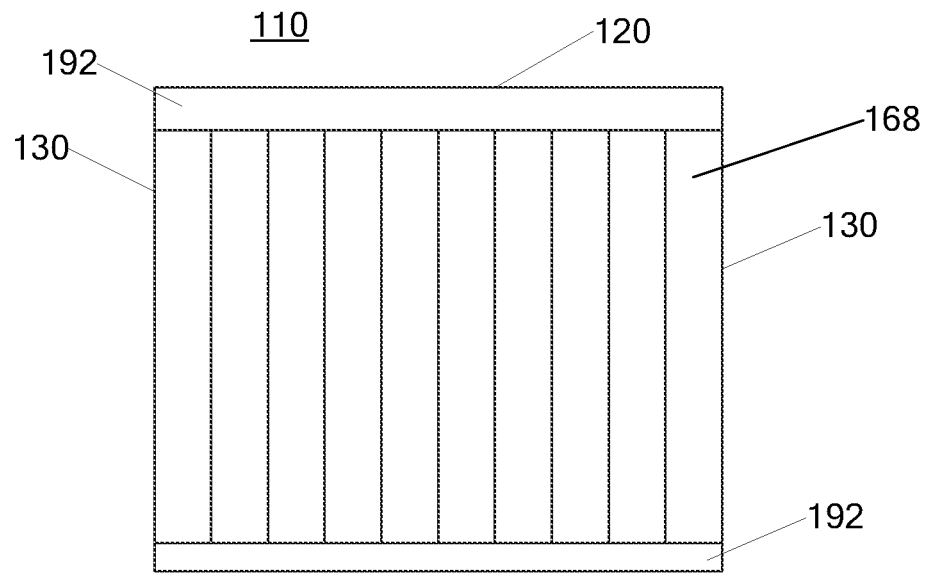
FIG. 8A to FIG. 8C are schematic structural diagrams of a further improved solution according to an embodiment of the present invention, where
Figure 8B:
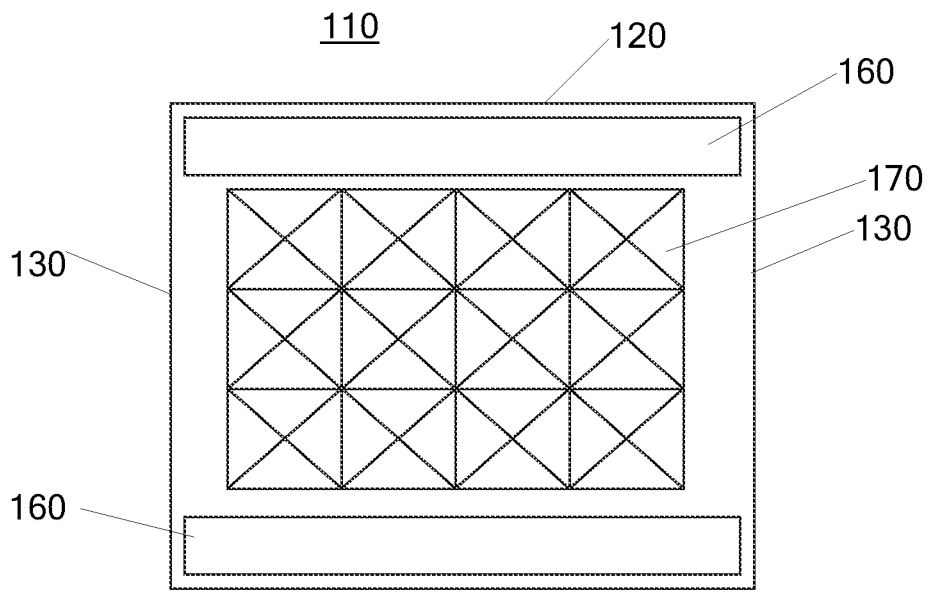
Figure 8C:
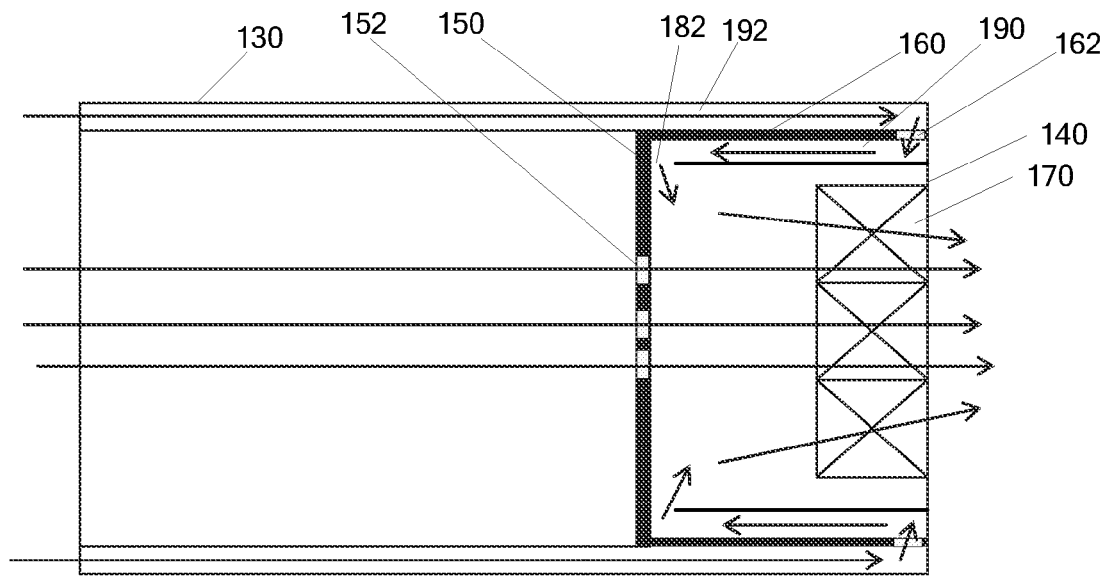

FIG. 8A to FIG. 8C are schematic structural diagrams of a further improved solution according to an embodiment of the present invention, where FIG. 8A is a left view of a heat dissipating device, FIG. 8B is a right view of the heat dissipating device, and FIG. 8C is a front view of the heat dissipating device.

A difference between the embodiment shown in FIG. 8A to FIG. 8C and the embodiments shown in FIG. 5 to FIG. 7 lies in that: In the embodiment shown in FIG. 8A to FIG. 8C, a functional module on the rear board 160 is disposed on a side that faces the fan 170. In this case, the backplane 150 vertically extends to the rear board 160, so that ends of the backplane 150 are separated from the horizontal wall panel 120, and an air intake channel 192 is formed between the rear board 160 and the horizontal wall panel 120. In this embodiment, the air intake channel 192 is formed between a side on which no functional module is installed on the rear board 160 and a neighboring horizontal wall panel 120. In this case, the partition plate 180 is disposed on a side which is of the rear board 160 and is closer to the fan 170. That is, the partition plate 180 is disposed on a side closer to the middle of the chassis 110 and separated from the rear board 160, and forms a cooling air duct 190 with the rear board 160. For ventilation, if the rear board 160 extends to the rear wall panel 140, one or more second hole areas 162 are provided at a rear end which is of the rear board 160 and is close to the rear panel 140, so that a cooling air flow from the air intake channel 192 enters the cooling air duct 190 through the second hole area 162. In the embodiment shown in FIG. 8A to FIG. 8C, in one case, a rear end of the partition plate 180 extends to the rear wall panel 140 and is connected to the rear wall panel 140 in a sealing manner, while a front end of the partition plate 180 extends to the backplane 150. In this case, a partition gap 182 used for ventilation is provided at the front end which is of the partition plate 180 and is close to the backplane 150, so that the cooling air flow from the air intake channel 192 passes the second hole area 162, traverses the functional module along the cooling air duct 190, enters a middle area of the chassis 110 through the partition gap 182, and is then discharged by the fan 170.

In such an embodiment, under the effect of the fan 170, the cooling air flow first passes the side on which no functional module requiring heat dissipation is disposed on the rear board 160, then passes the second hole area 162, further passes a side on which a functional module requiring heat dissipation is disposed on the rear board 160 and the fan 170, and is discharged out of the chassis 110.

Similarly, according to this embodiment of the present invention, an optical module with a high heat dissipation requirement may be installed on a rear part of the rear board 160, that is, a part which is close to the fan 170 and is far away from the backplane 150, so that when passing the side on which the functional module is disposed on the rear board 160, the cooling air flow first passes the optical module to dissipate heat of the optical module, and then dissipates heat of another functional module requiring heat dissipation on the rear board 160.

Although not indicated in FIG. 8A to FIG. 8C, multiple parallel rear boards 160 spaced away from each other may also exist in the embodiment shown in FIG. 8A to FIG. 8C. All functional modules on the multiple rear boards 160 are disposed on the side that faces the fan. The partition plate 180 is disposed on one side which is of a rear board 160 closest to the fan 170 among the multiple rear boards 160 and is close to the fan 170. That is to say, the partition plate 180 is disposed farthest away from the horizontal wall panel 120 as compared with each rear board 160. That is, a descending sequence of a distance from the fan is as follows: the horizontal wall panel 120, the multiple parallel rear boards 160 spaced away from each other, the partition plate 180, and the fan 170. With such structure, multiple cooling air ducts 190 roughly parallel to each other are formed between the multiple rear boards 160 and between a rear board 160 closest to the partition plate 180 and the partition plate 180. In this case, on a rear board 160 farthest away from the partition plate 180 (hereinafter referred to as a first rear board 160), one or more second hole areas 162 are provided at a rear end close to the rear wall panel 140; on a remaining rear board 160 (hereinafter referred to as a second rear board 160), second hole areas 162 are provided at a front end close to the backplane 150 and at a rear end close to the rear wall panel 140, so that the cooling air flow from the air intake channel 192 may simultaneously enter the multiple cooling air ducts 190 through each second hole area 162, and in the cooling air ducts 190, simultaneously traverses a functional module on each rear board 160 to simultaneously cool the functional module on the multiple rear boards 160. Same as the embodiments shown in FIG. 1A to FIG. 3, the cooling air flow respectively passes the air intake channel 192, the second hole area 162, the cooling air ducts 190, and the partition gap 182; and traverses a functional module on the rear boards 160 along the cooling air ducts 190, thereby avoiding a cascade heating effect generated in a process of cooling the functional module on the rear boards 160 and improving cooling efficiency. In addition, same as the embodiments shown in FIG. 5A to FIG. 7, in the embodiment shown in FIG. 8A to FIG. 8C, air ducts have a simple overall structure, thereby facilitating manufacturing and improving the cooling efficiency.

Although not indicated in the figures, a person skilled in the art should understand that in the embodiment shown in FIG. 8A to FIG. 8C, the trough cover 142 shown in FIG. 3 may also be disposed. The trough cover 142 helps cover ports and cables, so that an overall structure of the chassis is neat and nice-looking and maintenance is facilitated. In this case, the trough covers 142 are horizontally disposed in an upper part and a lower part of the rear wall panel 140, and correspond to the air intake channels 192 and the cooling air ducts 190.

According to this embodiment of the present invention, the rear boards 160, the partition plates 180, and the trough covers 142 that may exist are disposed roughly symmetrically at the top and the bottom of the chassis 110 along a longitudinal axis of the chassis 110.

Although not indicated in the figures, a person skilled in the art should understand that in some application scenarios, the embodiment shown in FIG. 5A to FIG. 5C may be combined with the embodiment shown in FIG. 8A to FIG. 8C. That is, a rear board 160 and a partition plate 180 in an upper part of the chassis may be disposed according to the embodiment shown in FIG. 5A to FIG. 5C, while a rear board 160 and a partition plate 180 in a lower part of the chassis may be disposed according to the embodiment shown in FIG. 8A to FIG. 8C; or a rear board 160 and a partition plate 180 in an upper part of the chassis may be disposed according to the embodiment shown in FIG. 8A to FIG. 8C, while a rear board 160 and a partition plate 180 in a lower part of the chassis may be disposed according to the embodiment shown in FIG. 5A to FIG. 5C. Such an embodiment also falls within the scope of the embodiments of the present invention.

This embodiment of the present invention not only applies to a case in which front boards and rear boards are vertical to each other, that is, front boards are horizontally plugged on a backplane while rear boards are vertically plugged on the backplane, or front boards are vertically plugged on a backplane while rear boards are horizontally plugged on the backplane; but this embodiment of the present invention also applies to a case in which front boards and rear boards are parallel to each other, that is, both front boards and rear boards are horizontally plugged on a backplane, or both front boards and rear boards are vertically plugged on a backplane. The following separately describes the two cases.

Figure 9A:
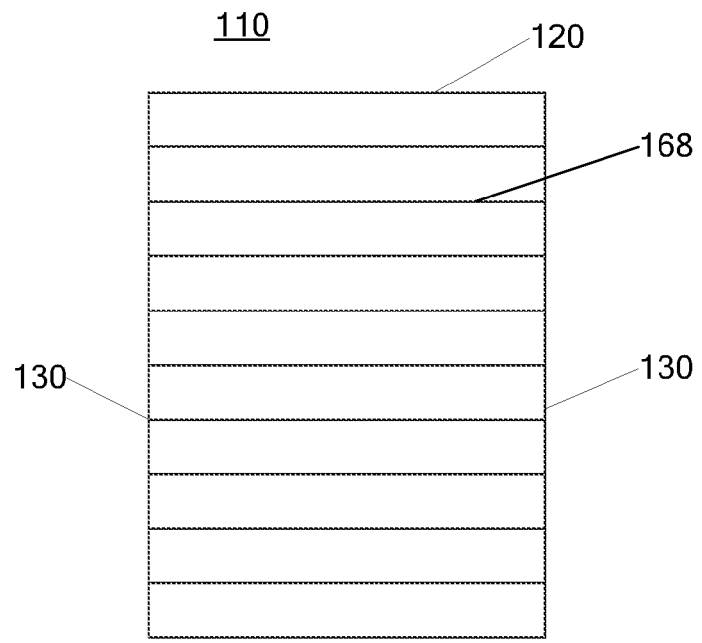
FIG. 9A to FIG. 9C are schematic structural diagrams of an alternative solution according to an embodiment of the present invention, where
Figure 9B:
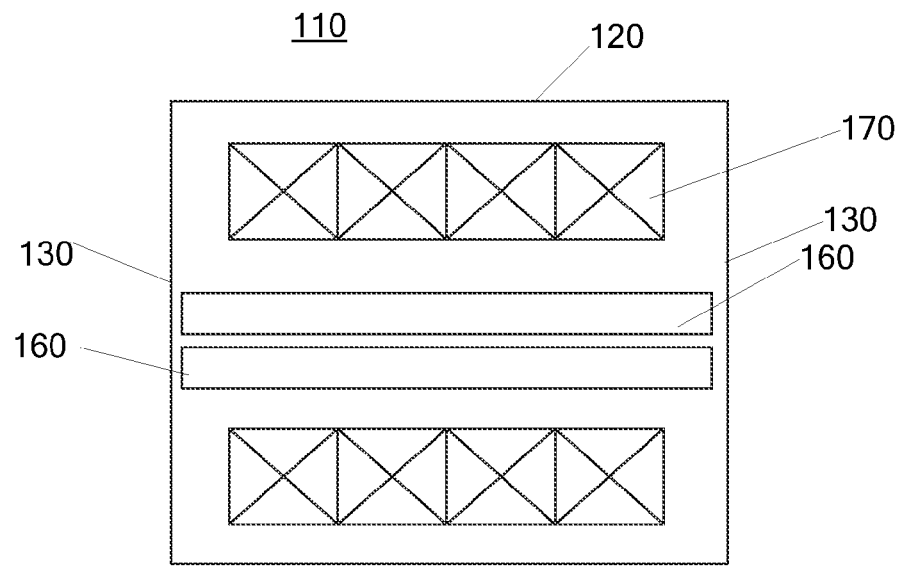
Figure 9C:
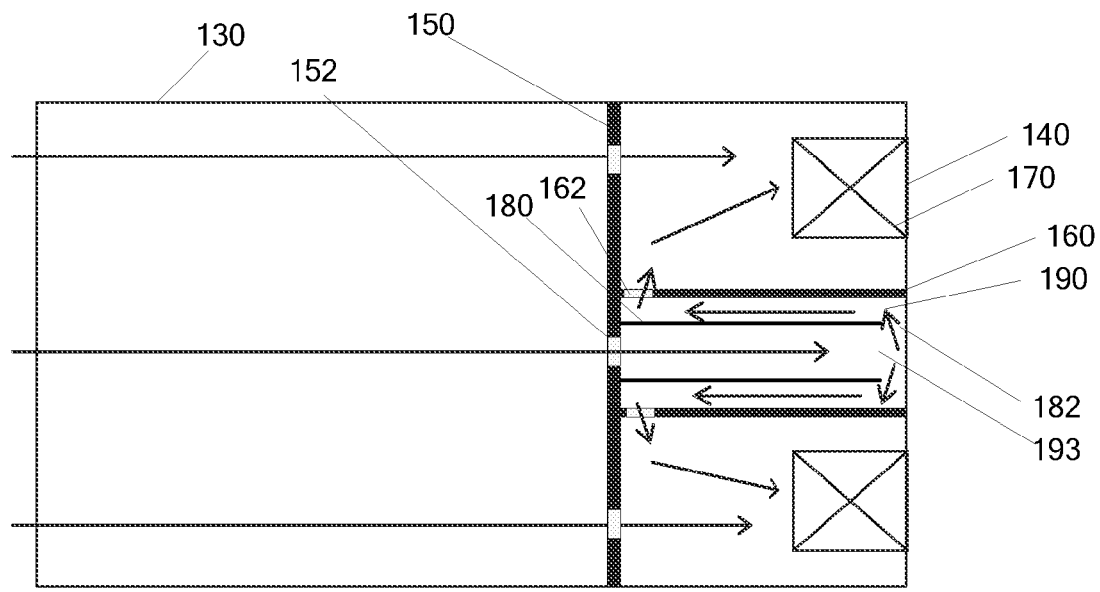

FIG. 9A to FIG. 9C are schematic structural diagrams of an alternative solution according to an embodiment of the present invention, and show a case in which both front boards and rear boards are horizontally plugged on a backplane. FIG. 9A is a left view of a heat dissipating device, FIG. 9B is a right view of the heat dissipating device, and FIG. 9C is a front view of the heat dissipating device.

As shown in FIG. 9A, front boards 168 of the heat dissipating device are spaced away from each other and horizontally plugged on a backplane 150. One or more first hole areas 152 are provided in a roughly middle area of the backplane 150 in terms of a vertical height, and used to ventilate the back of the backplane, so as to cool a functional module on rear boards 160. In such an embodiment, different from the embodiments shown in FIG. 1A to FIG. 8C, a dedicated air intake channel 192 does not need to be reserved in the front. In this way, an air duct structure is further simplified, an original chassis structure is not much changed, and a manufacturing cost is reduced.

As shown in FIG. 9B, the rear boards 160 are horizontally plugged in a roughly middle area of the backplane 150, and roughly parallel to horizontal wall panels 120 at the top and the bottom. Multiple fans 170 are in an array form and roughly disposed in upper and lower areas of a rear wall panel 140. In a current embodiment, multiple functional modules not indicated in the figures, such as an I/O port module and an optical module, are installed on a surface on one side which is of the rear board 160 and is far away from the fan 170. That is, functional modules located on an upper rear board 160 are installed on a lower side of the rear board, while functional modules located on a lower rear board 160 are installed on an upper side of the rear board.

As shown in FIG. 9C, in the current embodiment, two partition plates 180 are disposed and respectively correspond to the upper rear board 160 and the lower rear board 160. An upper partition plate 180 that corresponds to the upper rear board 160 is disposed on the lower side of the upper rear board 160, and a lower partition plate 180 that corresponds to the lower rear board 160 is disposed on the upper side of the lower rear board 160. In this way, an air intake channel 193 is formed between the upper partition plate 180 and the lower partition plate 180, a cooling air duct 190 is formed between the upper partition plate 180 and the upper rear board 160, a cooling air duct 190 is formed between the lower partition plate 180 and the lower rear board 160, and the air intake channel 193 corresponds to the first hole area 152 on the backplane 150. In this embodiment, the fans 170, the rear boards 160, and the partition plates 180 are disposed roughly symmetrically in the chassis along a longitudinal axis of the chassis 110. The upper and lower partition plates 180 extend to positions near the rear wall panel 140, so that partition gaps 182 are formed between rear ends which are of the upper and lower partition plates 180 and are close to the rear wall panel 140, and the rear wall panel 140. In this way, a cooling air flow that enters from the air intake channel 193 may enter the cooling air ducts 190 through the partition gaps 182 and traverse a functional module on the rear boards 160 along the cooling air ducts 190. One or more second hole areas 162 are provided at ends which are of the upper and lower rear boards 160 and are close to the backplane 150, so that the cooling air flow from the cooling air ducts 190 enters an upper space and a lower space of the chassis through the second hole area 162 and is then discharged out of the chassis 110 by the fan 170.

In this case, under the effect of the fan 170, the cooling air flow first passes a side on which a functional module requiring heat dissipation is disposed on the rear board 160, then passes the second hole area 162 and the fan 170, and is discharged out of the chassis 110.

According to this embodiment of the present invention, an optical module with a high heat dissipation requirement may be installed on a rear part of the rear board 160, that is, a part which is close to the fan 170 and is far away from the backplane 150, so that when passing the side on which the functional module is disposed on the rear board 160, the cooling air flow first passes the optical module to dissipate heat of the optical module, and then dissipates heat of another functional module requiring heat dissipation on the rear board 160.

Although not indicated in the figures, the rear boards 160 in the embodiment shown in FIG. 9A to FIG. 9C may include multiple parallel rear boards disposed side by side. In this case, the partition plate 180 is farthest away from the horizontal wall panel 120 as compared with each rear board 160, so that the cooling air ducts 190 are formed between the rear boards 160 and between a rear board 160 farthest away from the horizontal wall panel 120 and the partition plate 180. In this way, the cooling air flow simultaneously traverses, through the partition gaps 182 and the second hole area 162, the functional module on the rear boards 160 along the cooling air ducts.

Figure 10A:
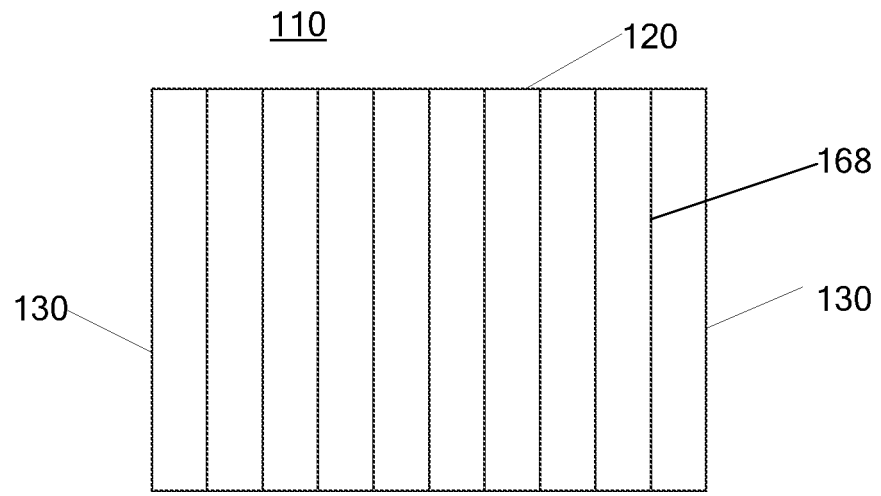
FIG. 10A to FIG. 10C are schematic structural diagrams of an alternative solution according to an embodiment of the present invention, where
Figure 10B:
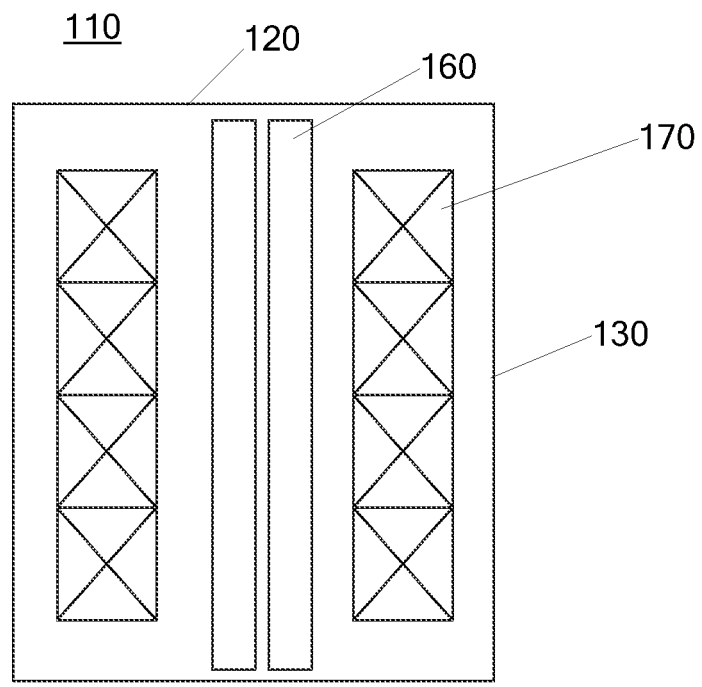
Figure 10C:
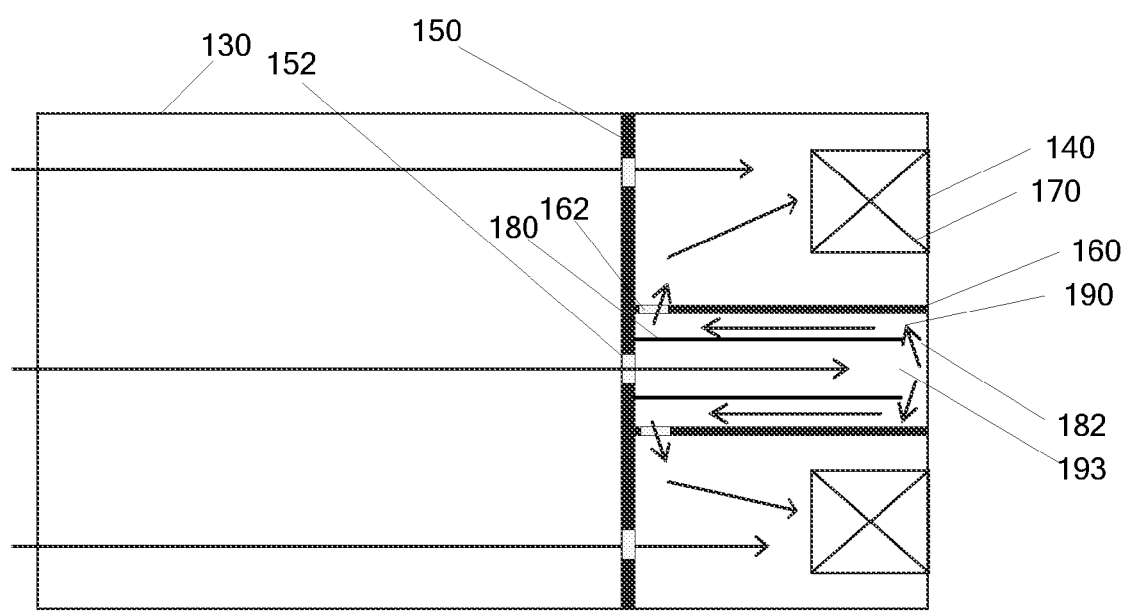

FIG. 10A to FIG. 10C are schematic structural diagrams of an alternative solution according to an embodiment of the present invention, and show a case in which both front boards and rear boards are vertically plugged on a backplane. FIG. 10A is a left view of a heat dissipating device, FIG. 10B is a right view of the heat dissipating device, and FIG. 10C is a top view of the heat dissipating device. If it is considered according to FIG. 10C that an upper part is a right side of a chassis 110 while a lower part is a left side of the chassis 110, rear boards 160 are vertically plugged in a roughly middle area of a backplane 150 and parallel to vertical wall panels 130 on the left and right sides. Multiple fans 170 are in an array form and roughly disposed in areas on the left and right sides of a rear wall panel 140, that is, disposed in edge areas of the rear wall panel 140 along the vertical wall panels 130. In a current embodiment, multiple functional modules not indicated in the figures, such as an I/O port module and an optical module, are installed on a surface on one side which is of the rear board 160 and is far away from the fan 170. That is, functional modules located on a left rear board 160 are installed on the right side of the rear board, while functional modules located on a right rear board 160 are installed on the left side of the rear board.

In the current embodiment, two partition plates 180 are disposed and respectively correspond to the left rear board 160 and the right rear board 160. A left partition plate 180 that corresponds to the left rear board 160 is disposed on the right side of the left rear board 160, and a right partition plate 180 that corresponds to the right rear board 160 is disposed on the left side of the right rear board 160. In this way, an air intake channel 193 is formed between the left partition plate 180 and the right partition plate 180, a cooling air duct 190 is formed between the left partition plate 180 and the left rear board 160, a cooling air duct 190 is formed between the right partition plate 180 and the right rear board 160, and the air intake channel 193 corresponds to a first hole area 152 on the backplane 150. The left and right partition plates 180 extend to positions near the rear wall panel 140, so that partition gaps 182 are formed between ends which are of the left and right partition plates 180 and are close to the rear wall panel 140, and the rear wall panel 140. In this way, a cooling air flow that enters from the air intake channel 193 may enter the cooling air ducts 190 through the partition gaps 182. One or more second hole areas 162 are provided at ends which are of the left and right rear boards 160 and are close to the backplane 150, so that the cooling air flow from the cooling air ducts 190 enters an upper space and a lower space of the chassis through the second hole area 162 and is then discharged out of the chassis 110 by the fan 170.

Although not indicated in the figures, the rear boards 160 in this embodiment include multiple parallel rear boards disposed side by side. In this case, the partition plate 180 is farthest away from the fan 170 as compared with each rear board 160, so that the cooling air ducts 190 are formed between the rear boards 160 and between a rear board 160 farthest away from the vertical wall panel and the partition plate 180. In this way, the cooling air flow simultaneously traverses, through the partition gaps 182 and the second hole area, the functional module on the rear boards along the cooling air ducts 190.

A common advantage of the embodiments of the present invention shown in FIG. 9A to FIG. 10C is that a change to an existing chassis structure is little and a dedicated air intake channel does not need to be reserved on a front side of the chassis, thereby further simplifying an air duct structure and improving cooling efficiency.

Another aspect of the embodiments of the present invention further provides a blade server, where the blade server may include the heat dissipating device described in the foregoing. In addition, other necessary components and devices may be assembled for the blade server as required.

The foregoing descriptions are merely specific implementation manners of the present invention, but are not intended to limit the protection scope of the present invention. Any variation or replacement readily figured out by a person skilled in the art within the technical scope disclosed in the present invention shall fall within the protection scope of the present invention. Therefore, the protection scope of the present invention shall be subject to the protection scope of the claims.

What is claimed is:

1. A heat dissipating device used for a blade server, comprising:
a chassis;
a backplane;
two or more rear boards; and
at least one fan,
wherein the chassis comprises horizontal wall panels, vertical wall panels, and a rear wall panel,
wherein the backplane is disposed in the chassis and is configured to connect to a front board inserted from a front of the chassis and the two or more rear boards inserted from a back of the chassis,
wherein the at least one fan is disposed in a rear part of the chassis and is configured to dissipate heat out of the chassis,
wherein the backplane has one or more first hole areas such that under an effect of the at least one fan, heat generated by the front board is discharged out of the chassis through the one or more first hole areas after passing the backplane and the at least one fan,
wherein the chassis comprises one or more partition plates,
wherein the two or more rear boards comprise a first rear board and a second rear board,
wherein the first rear board comprises two or more second hole areas, and the second rear board comprises one or more second hole areas,
wherein the one or more partition plates, the horizontal wall panels, the vertical wall panels, the rear wall panel, the backplane, and the two or more rear boards form a cooling air duct that does not pass the front board such that under the effect of the at least one fan, a cooling air flow is discharged out of the chassis after passing the two or more rear boards and the at least one fan to implement heat dissipation for a functional module on the two or more rear boards,
wherein the first rear board and the second rear board are disposed side by side on one side of the at least one fan,
wherein the first rear board is a rear board at which the cooling air flow first arrives,
wherein the second rear board is a rear board at which the cooling air flow next arrives,
wherein the two or more second hole areas for the first rear board are provided respectively at a front end of the first rear board that is close to the backplane and a rear end of the first rear board that is close to the rear wall panel, and
wherein the one or more second hole areas for the second rear board are provided at a front end of the second rear board that is close to the backplane.

2. The device according to claim 1, wherein under the effect of the at least one fan, the cooling air flow first passes a side on which a functional module requiring heat dissipation is disposed on the first rear board, then passes the second rear board, and the at least one fan, and is discharged out of the chassis, or wherein under the effect of the at least one fan, the cooling air flow first passes a side on which no functional module requiring heat dissipation is disposed on the first rear board, then passes a side on which the functional module requiring heat dissipation is disposed on the second rear board, the at least one fan, and is discharged out of the chassis.

3. The device according to claim 2, wherein after the cooling air flow arrives at the second hole area at the rear end of the first rear board under the effect of the at least one fan, one part of the cooling air flow passes a side on which a functional module requiring heat dissipation is disposed on the first rear board to dissipate heat of the functional module, and is discharged out of the chassis by the at least one fan after passing the second hole area on the second rear board, and wherein another part of the cooling air flow arrives at a side on which a functional module requiring heat dissipation is disposed on the second rear board to dissipate heat of the functional module, and is discharged out of the chassis by the at least one fan after passing the second hole area on the second rear board.

4. The device according to claim 2, wherein the rear wall panel, the vertical wall panels, and the horizontal wall panels in the chassis form a protrusive trough cover, wherein the trough cover covers a rear part of the chassis in a sealing manner, wherein the rear part of the chassis is a part which is close to the at least one fan and is away from the backplane, and wherein after the cooling air flow arrives at the trough cover under the effect of the at least one fan, the cooling air flow passes respectively a side on which a functional module requiring heat dissipation is disposed on the first rear board and a side on which a functional module requiring heat dissipation is disposed on the second rear board, flows out respectively from the second hole area at the front end of the first rear board and the second hole area at the front end of the second rear board, and is discharged out of the chassis by the at least one fan.

5. The device according to claim 1, the cooling air flow first passes an optical module to dissipate heat of the optical module, and then dissipates heat of another functional module requiring heat dissipation.

6. The device according to claim 1, wherein the cooling air duct is located on a left side or a right side of the chassis, or wherein the cooling air duct is located on both the left side and the right side of the chassis.

7. A blade server, comprising:
a chassis;
a backplane;
at least one front board;
two or more rear boards; and
at least one fan,
wherein the chassis comprises horizontal wall panels, vertical wall panels, and a rear wall panel, wherein the backplane is disposed in the chassis and is configured to connect to the at least one front board inserted from a front of the chassis and the two or more rear boards inserted from a back of the chassis, wherein the at least one fan is disposed in a rear part of the chassis and is configured to dissipate heat out of the chassis, wherein the backplane has one or more first hole areas such that under an effect of the at least one fan, heat generated by the at least one front board is discharged out of the chassis through the one or more first hole areas after passing the backplane and the at least one fan, wherein the chassis comprises one or more partition plates, wherein the two or more rear boards comprise a first rear board and a second rear board, wherein the first rear board comprises two or more second hole areas, and the second rear board comprises one or more second hole areas, wherein the one or more partition plates, the horizontal wall panels, the vertical wall panels, the rear wall panel, the backplane, and the two or more rear boards form a cooling air duct that does not pass the at least one front board such that under the effect of the at least one fan, a cooling air flow is discharged out of the chassis after passing the two or more rear boards and the at least one fan to implement heat dissipation for a functional module on the two or more rear boards, wherein the first rear board and the second rear board are disposed side by side on one side of the at least one fan, wherein the first rear board is a rear board at which the cooling air flow first arrives, wherein the second rear board is a rear board at which the cooling air flow next arrives, wherein the two or more second hole areas for the first rear board are provided respectively at a front end of the first rear board that is close to the backplane and a rear end of the first rear hoard that is close to the rear wall panel, and wherein the one or more second hole areas for the second rear board are provided at a front end of the second rear board that is close to the backplane.

8. The server according to claim 7, wherein under the effect of the at least one fan, the cooling air flow first passes a side on which a functional module requiring heat dissipation is disposed on the first rear board, then passes the second rear board, and the at least one fan, and is discharged out of the chassis, or wherein under the effect of the at least one fan, the cooling air flow first passes a side on which no functional module requiring heat dissipation is disposed on the first rear board, then passes a side on which the functional module requiring heat dissipation is disposed on the second rear board, the at least one fan, and is discharged out of the chassis.

9. The server according to claim 8, wherein after the cooling air flow arrives at the second hole area at the rear end of the first rear board under the effect of the at least one fan, one part of the cooling air flow passes a side on which a functional module requiring heat dissipation is disposed on the first rear board to dissipate heat of the functional module, and is discharged out of the chassis by the at least one fan after passing the second hole area on the second rear board, and wherein another part of the cooling air flow arrives at a side on which a functional module requiring heat dissipation is disposed on the second rear board to dissipate heat of the functional module, and is discharged out of the chassis by the at least one fan after passing the second hole area on the second rear board.

10. The server according to claim 7, wherein the cooling air flow first passes an optical module to dissipate heat of the optical module, and then dissipates heat of another functional module requiring heat dissipation.

11. A heat dissipating device used for a blade server, comprising:
a chassis;
a backplane;
at least one rear board; and
at least one fan, wherein the chassis comprises horizontal wall panels, vertical wall panels, and a rear wall panel, wherein the backplane is disposed in the chassis and is configured to connect to a front board inserted from a front of the chassis and the at least one rear board inserted from a back of the chassis, wherein the at least one fan is disposed in a rear part of the chassis and is configured to dissipate heat out of the chassis, wherein the backplane has one or more first hole areas such that under an effect of the at least one fan, heat generated by the front board is discharged out of the chassis through the one or more first hole areas after passing the backplane and the at least one fan, wherein the chassis comprises one or more partition plates, wherein the at least one rear board comprises one or more second hole areas, wherein the one or more partition plates, the horizontal wall panels, the vertical wall panels, the rear wall panel, the backplane, and the at least one rear board form a cooling air duct that does not pass the front board such that under the effect of the at least one fan, a cooling air flow is discharged out of the chassis after passing the at least one rear board, the one or more second hole areas, and the at least one fan to implement heat dissipation for a functional module on the at least one rear board, wherein the rear wall panel, the vertical wall panels, and the horizontal wall panels in the chassis form a protrusive trough cover, wherein the trough cover covers a rear part of the chassis in a sealing manner, wherein the rear part of the chassis is a part which is close to the at least one fan and is away from the backplane, wherein the device comprises two or more rear boards, wherein the two or more rear boards comprise a first rear board and a second rear board, wherein the first rear board and the second rear board are disposed side by side on one side of the at least one fan, wherein the first rear board is a rear board at which the cooling air flow first arrives, wherein the second rear board is a rear board at which the cooling air flow next arrives, wherein the second hole area is provided at a front end of the first rear board and is close to the backplane, wherein the second hole area is provided at a front end of the second rear board and is close to the backplane, and wherein after the cooling air flow arrives at the trough cover under the effect of the at least one fan, the cooling air flow passes respectively a side on which a functional module requiring heat dissipation is disposed on the first rear board and a side on which a functional module requiring heat dissipation is disposed on the second rear board, flows out respectively from the second hole area at the front end of the first rear board and the second hole area at the front end of the second rear board, and is discharged out of the chassis by the at least one fan.

* * * * *